(12) United States Patent
Lindholm et al.

(10) Patent No.: US 8,211,763 B2
(45) Date of Patent: *Jul. 3, 2012

(54) METHODS OF FORMING VERTICAL FIELD EFFECT TRANSISTORS, VERTICAL FIELD EFFECT TRANSISTORS, AND DRAM CELLS

(75) Inventors: Larson D. Lindholm, Boise, ID (US); David K. Hwang, Boise, ID (US)

(73) Assignee: Micron Technologies, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/036,725

(22) Filed: Feb. 28, 2011

(65) Prior Publication Data

US 2011/0140187 A1  Jun. 16, 2011

Related U.S. Application Data

(63) Continuation of application No. 12/187,809, filed on Aug. 7, 2008, now Pat. No. 7,910,971.

(51) Int. Cl.
 *H01L 27/108* (2006.01)
 *H01L 21/8242* (2006.01)
 *H01L 21/336* (2006.01)
 *H01L 29/78* (2006.01)

(52) U.S. Cl. ......... 438/253; 257/E21.646; 257/E29.262; 257/E27.084

(58) Field of Classification Search .............. 257/306, 257/329, E21.646, E21.41, E29.262, E27.084; 438/253, 268
See application file for complete search history.

(56) References Cited

U.S. PATENT DOCUMENTS

| 7,176,089 B2 | 2/2007 | Furukawa et al. |
| 7,285,812 B2 | 10/2007 | Tang et al. |
| 7,910,971 B2 * | 3/2011 | Lindholm et al. ............ 257/296 |
| 2006/0046392 A1 | 3/2006 | Manning et al. |

FOREIGN PATENT DOCUMENTS

| JP | 60160169 | 8/1985 |
| JP | 7254647 | 10/1995 |

* cited by examiner

*Primary Examiner* — Eugene Lee
*Assistant Examiner* — Monica D Harrison
(74) *Attorney, Agent, or Firm* — Wells St. John, P.S.

(57) ABSTRACT

A method of forming a vertical field effect transistor includes etching an opening into semiconductor material. Sidewalls and radially outermost portions of the opening base are lined with masking material. A semiconductive material pillar is epitaxially grown to within the opening adjacent the masking material from the semiconductor material at the opening base. At least some of the masking material is removed from the opening. A gate dielectric is formed radially about the pillar. Conductive gate material is formed radially about the gate dielectric. An upper portion of the pillar is formed to comprise one source/drain region of the vertical transistor. Semiconductive material of the pillar received below the upper portion is formed to comprise a channel region of the vertical transistor. Semiconductor material adjacent the opening is formed to comprise another source/drain region of the vertical transistor. Other aspects and implementations are contemplated.

11 Claims, 31 Drawing Sheets

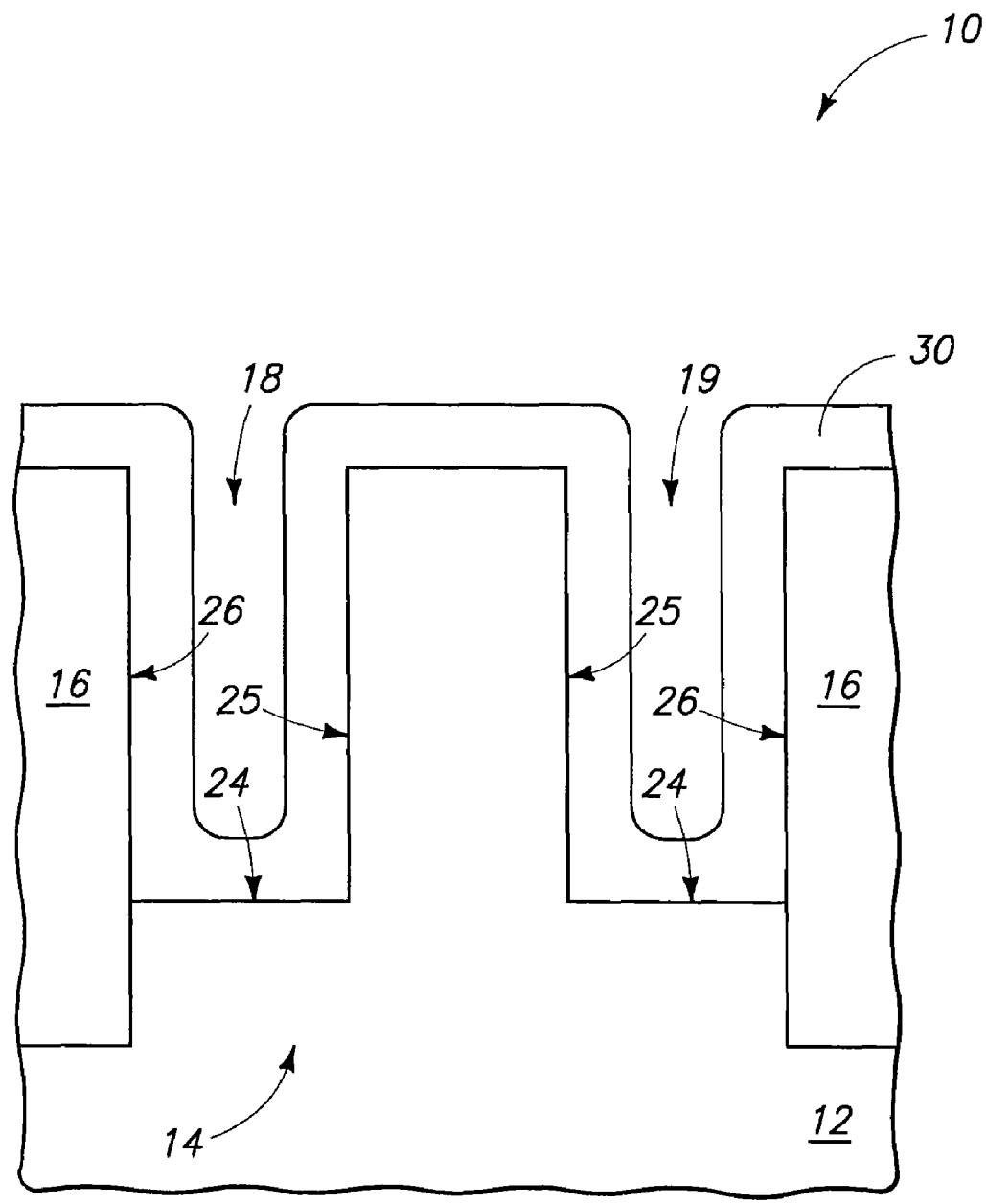

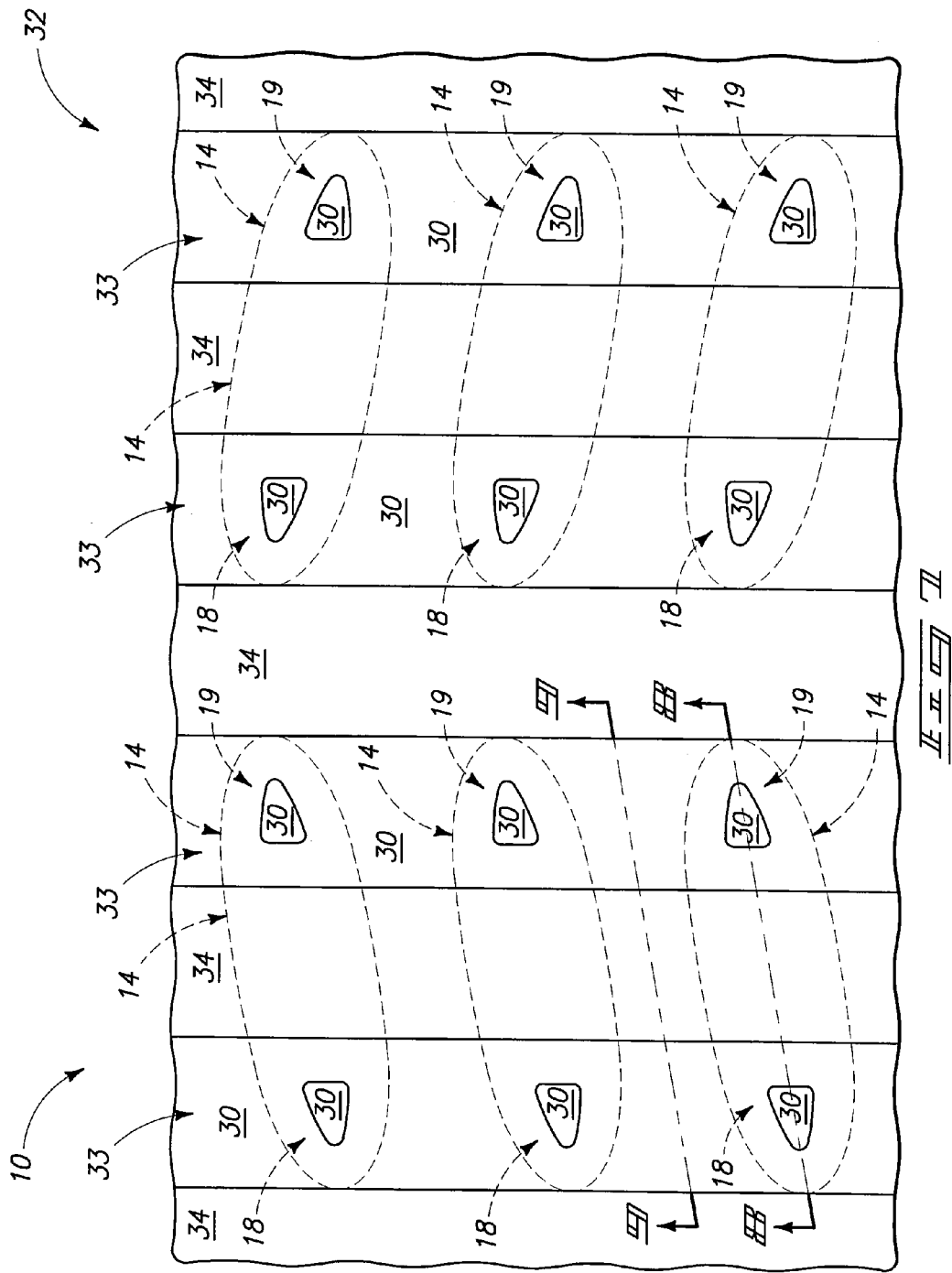

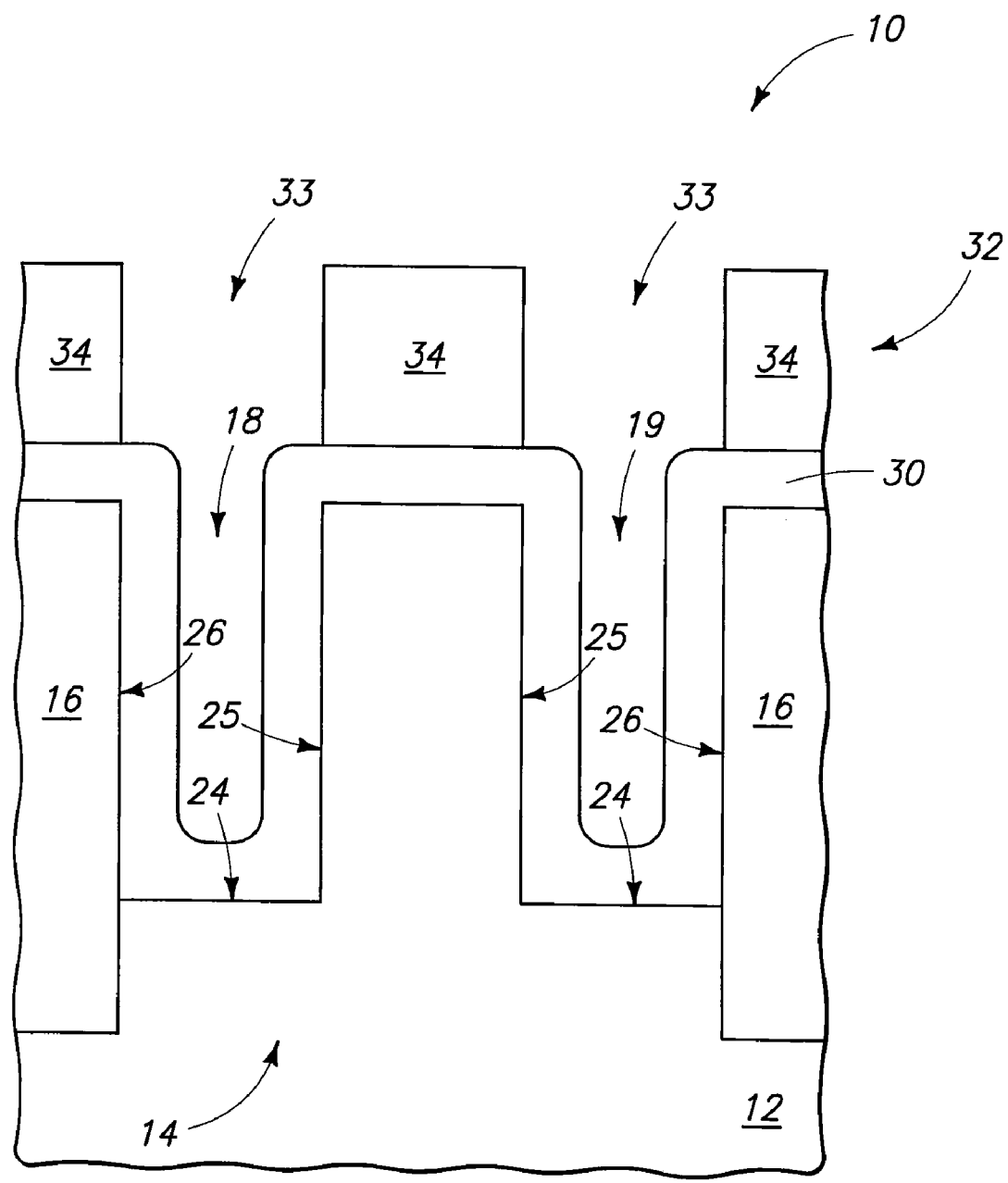
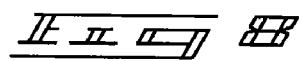

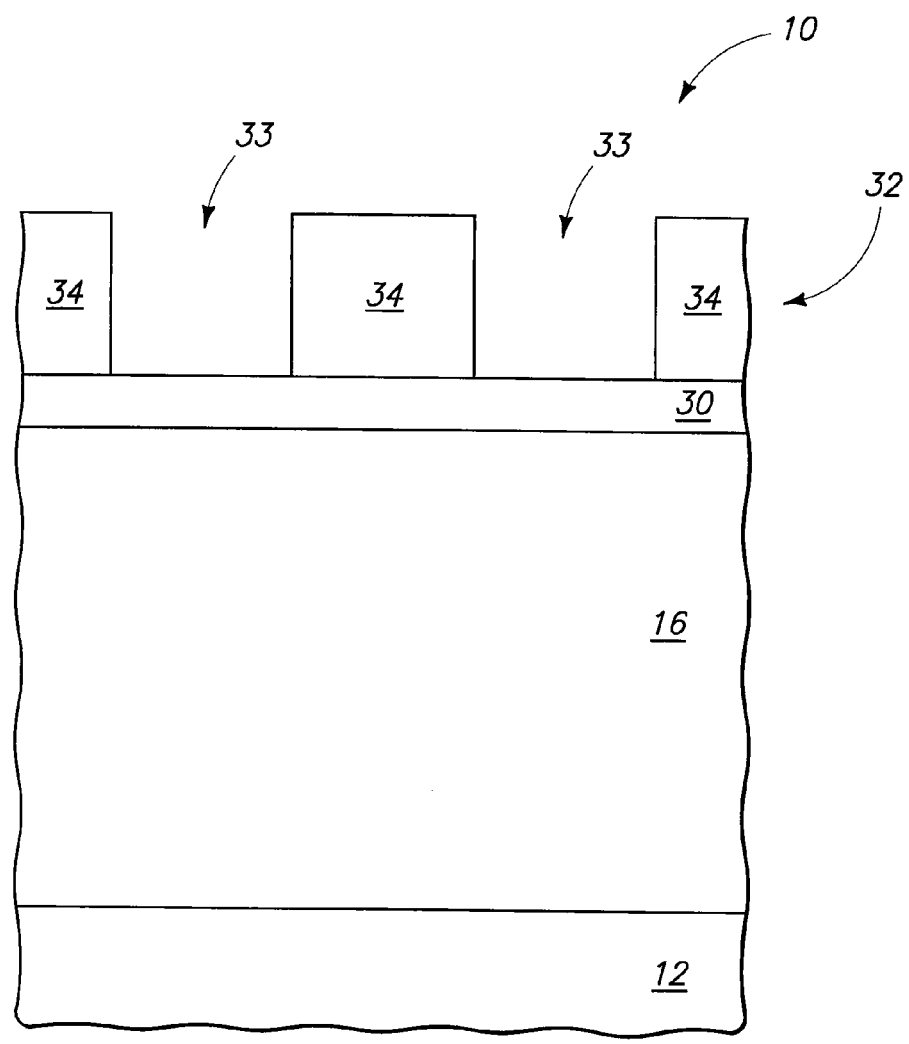

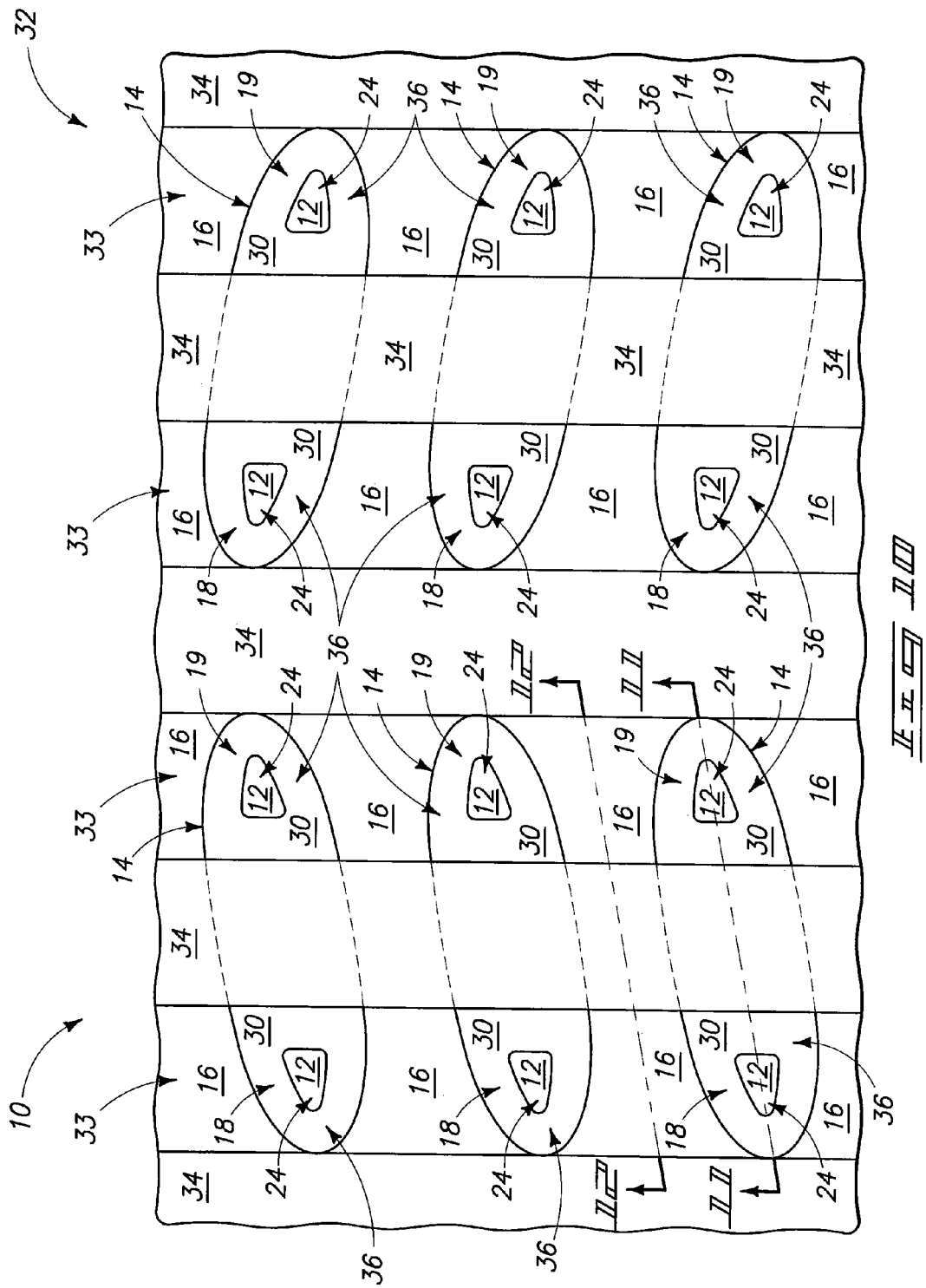

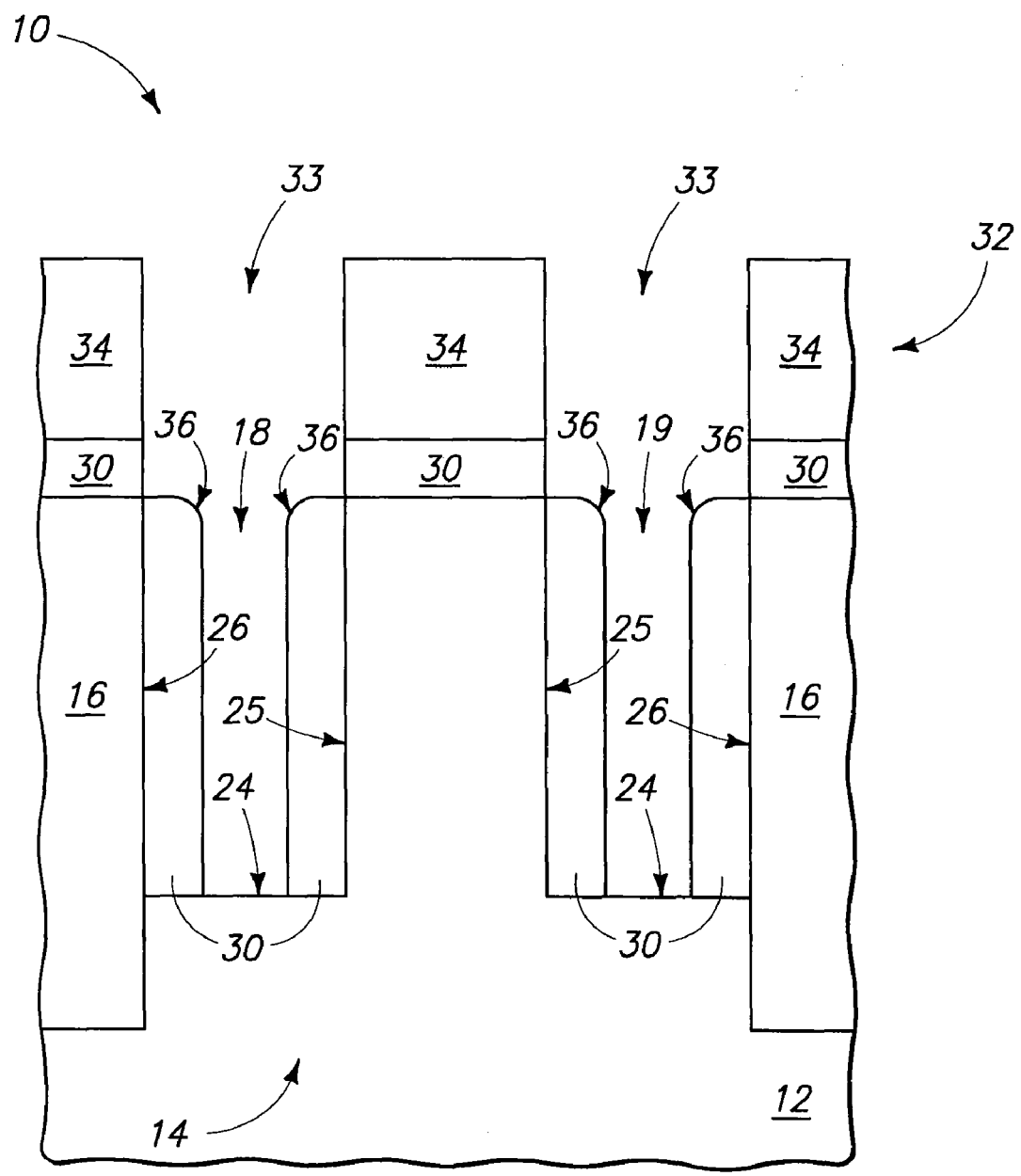

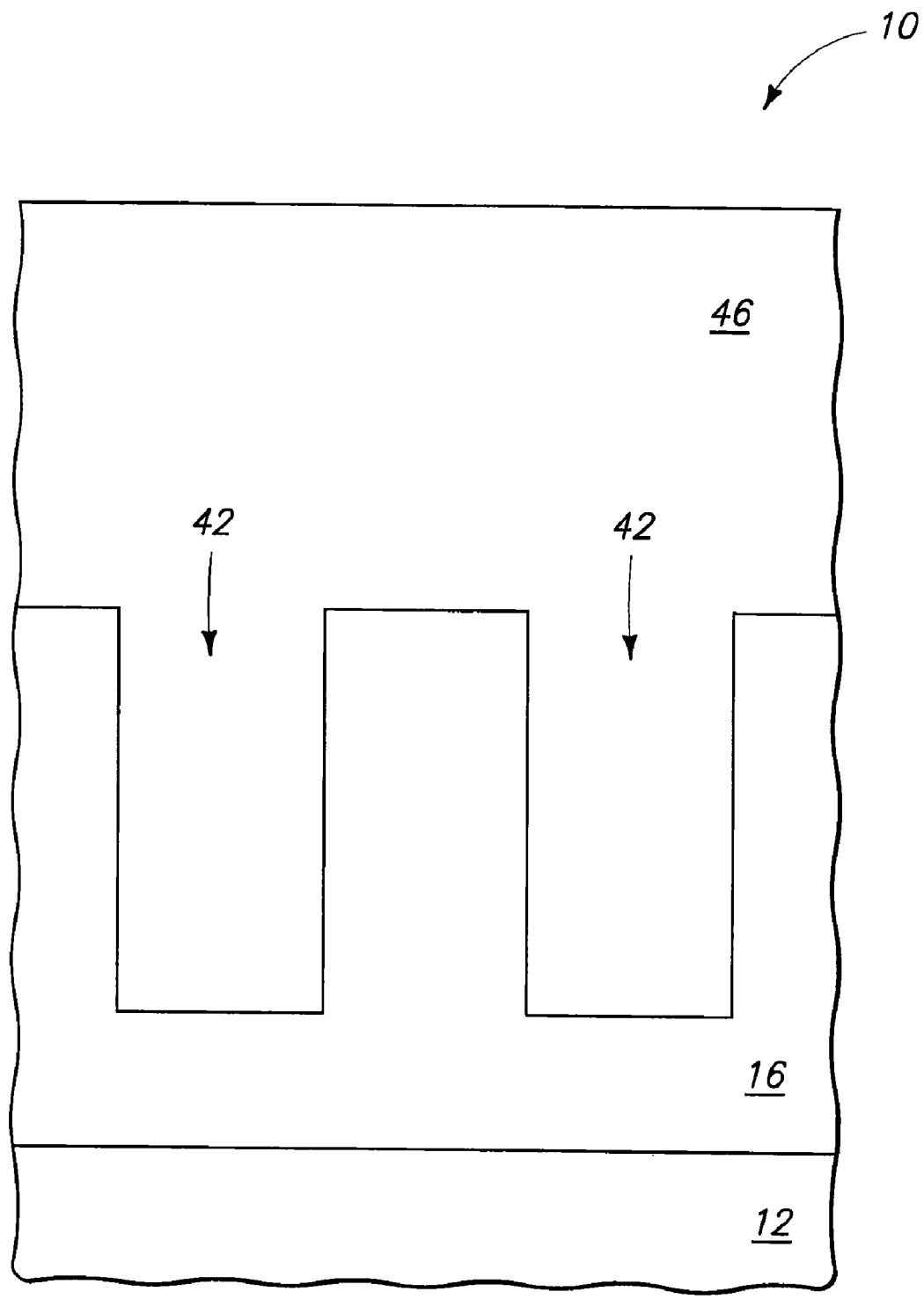
_Fig 20_

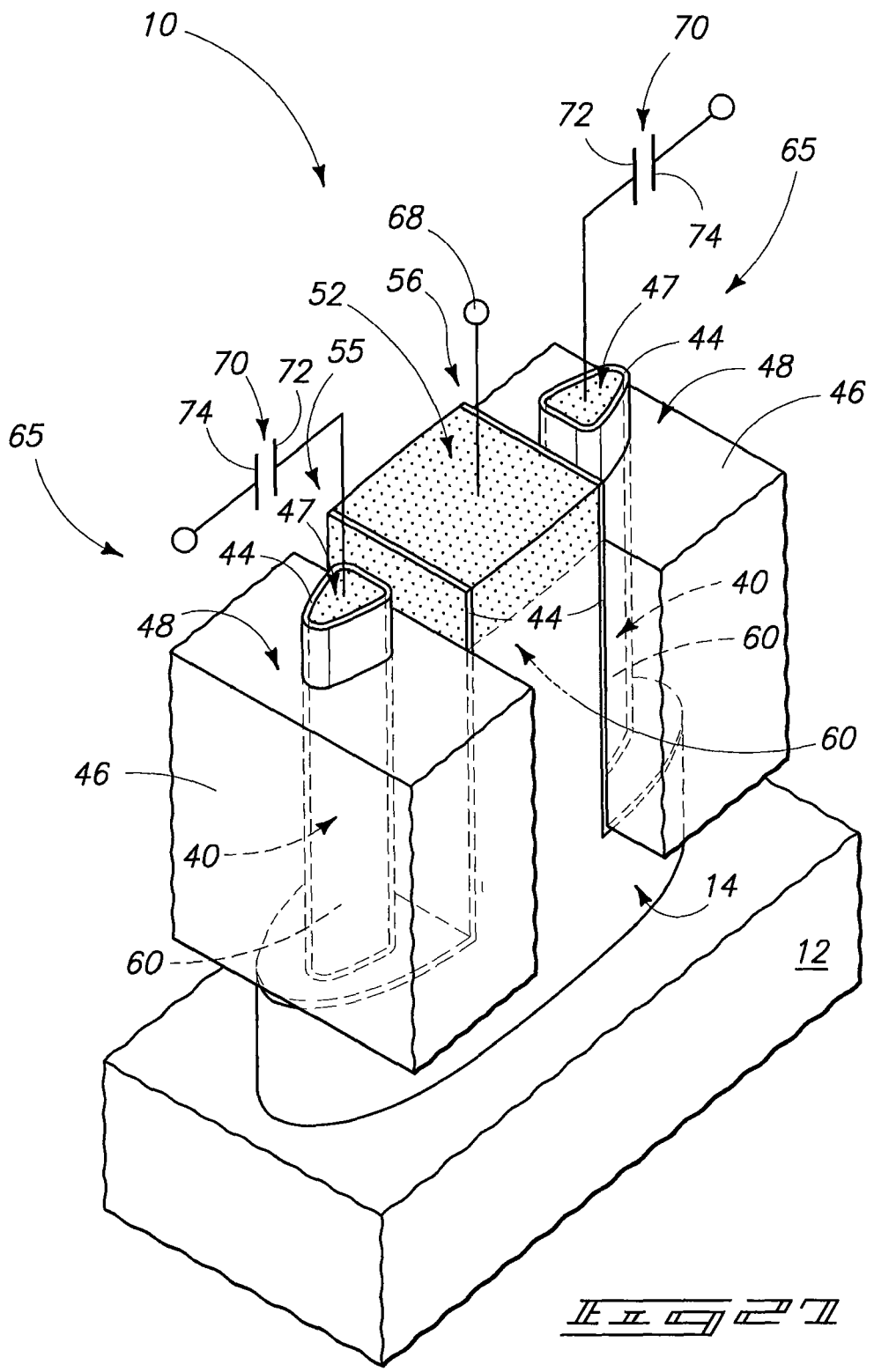

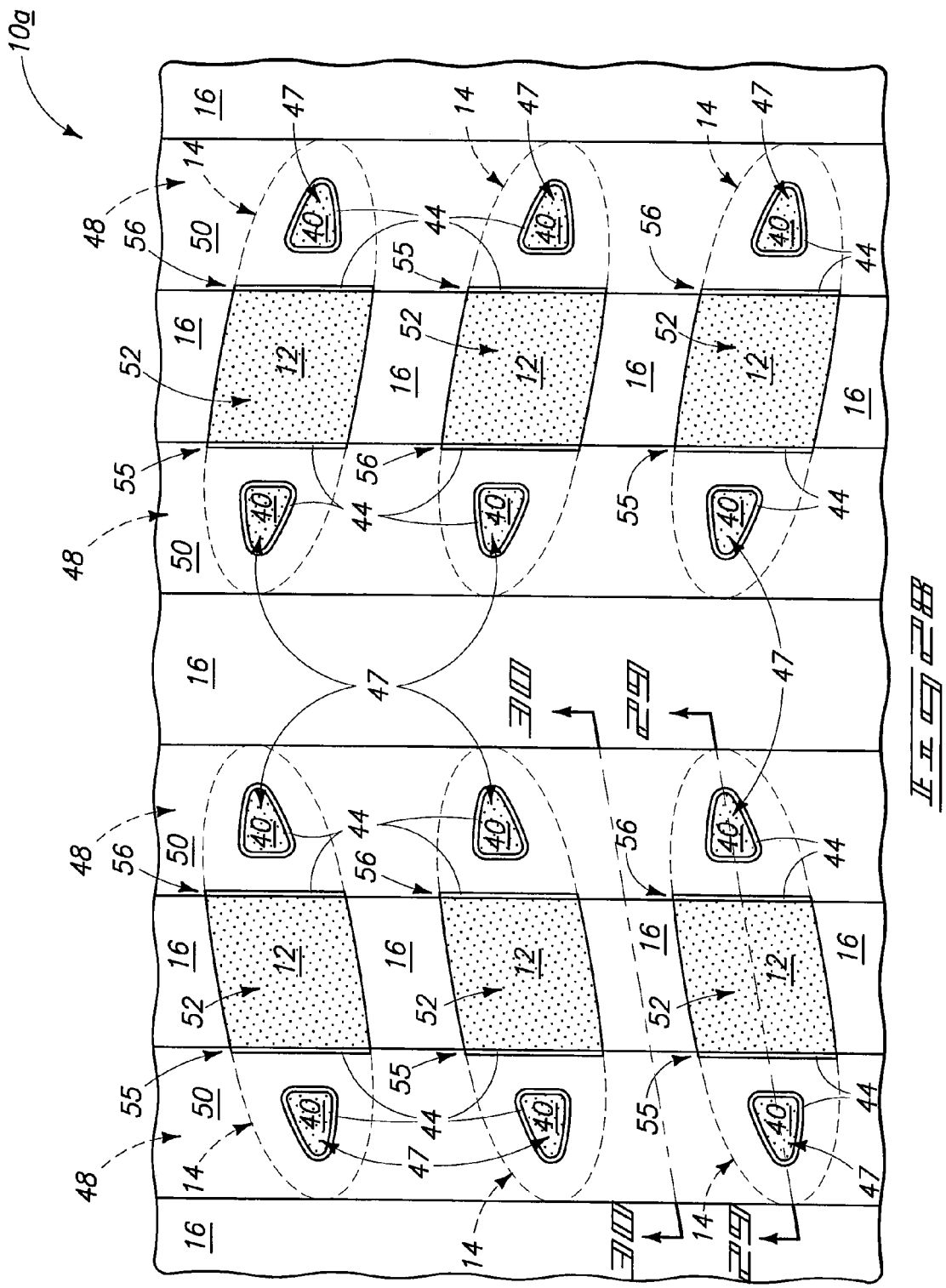

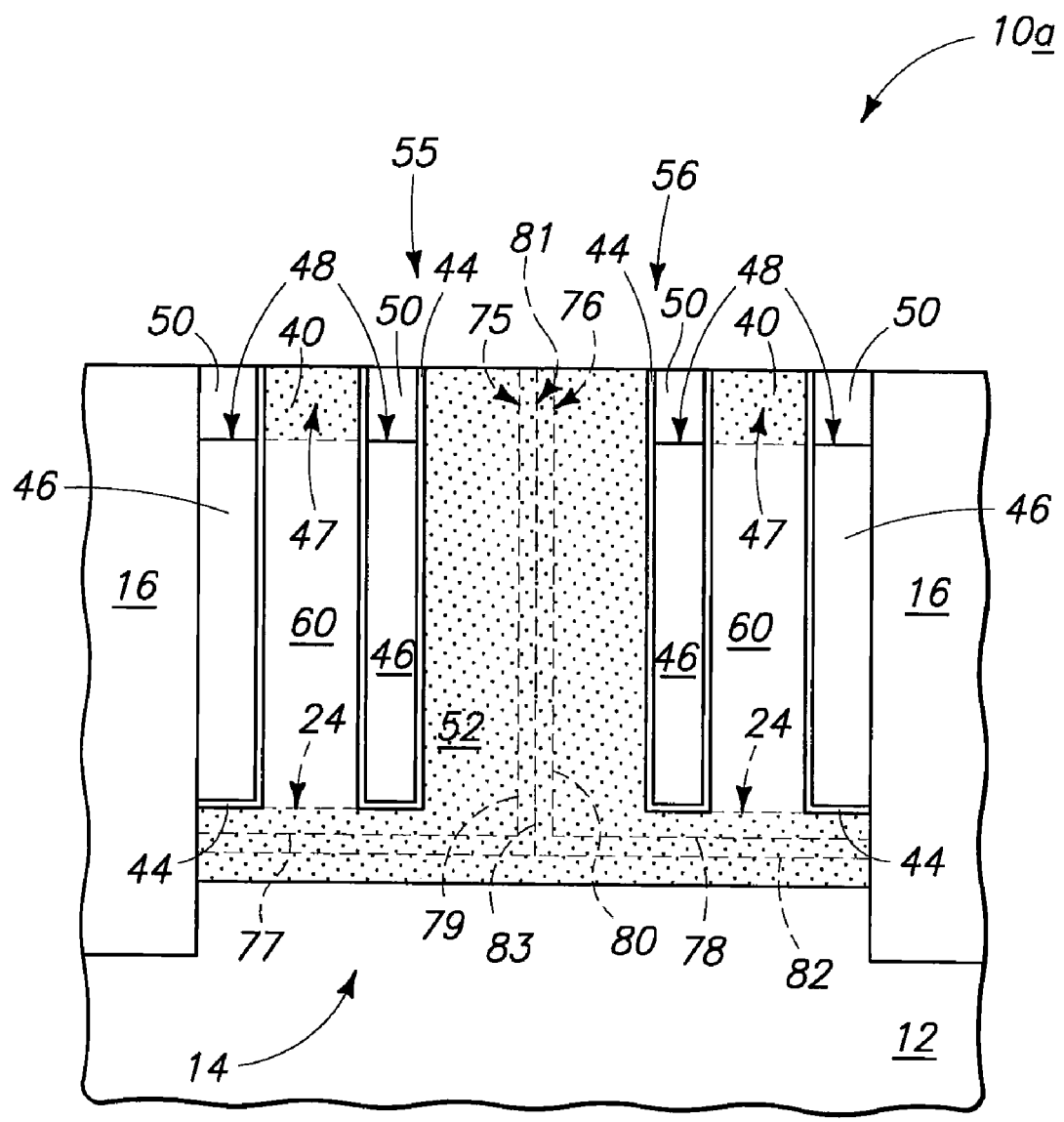

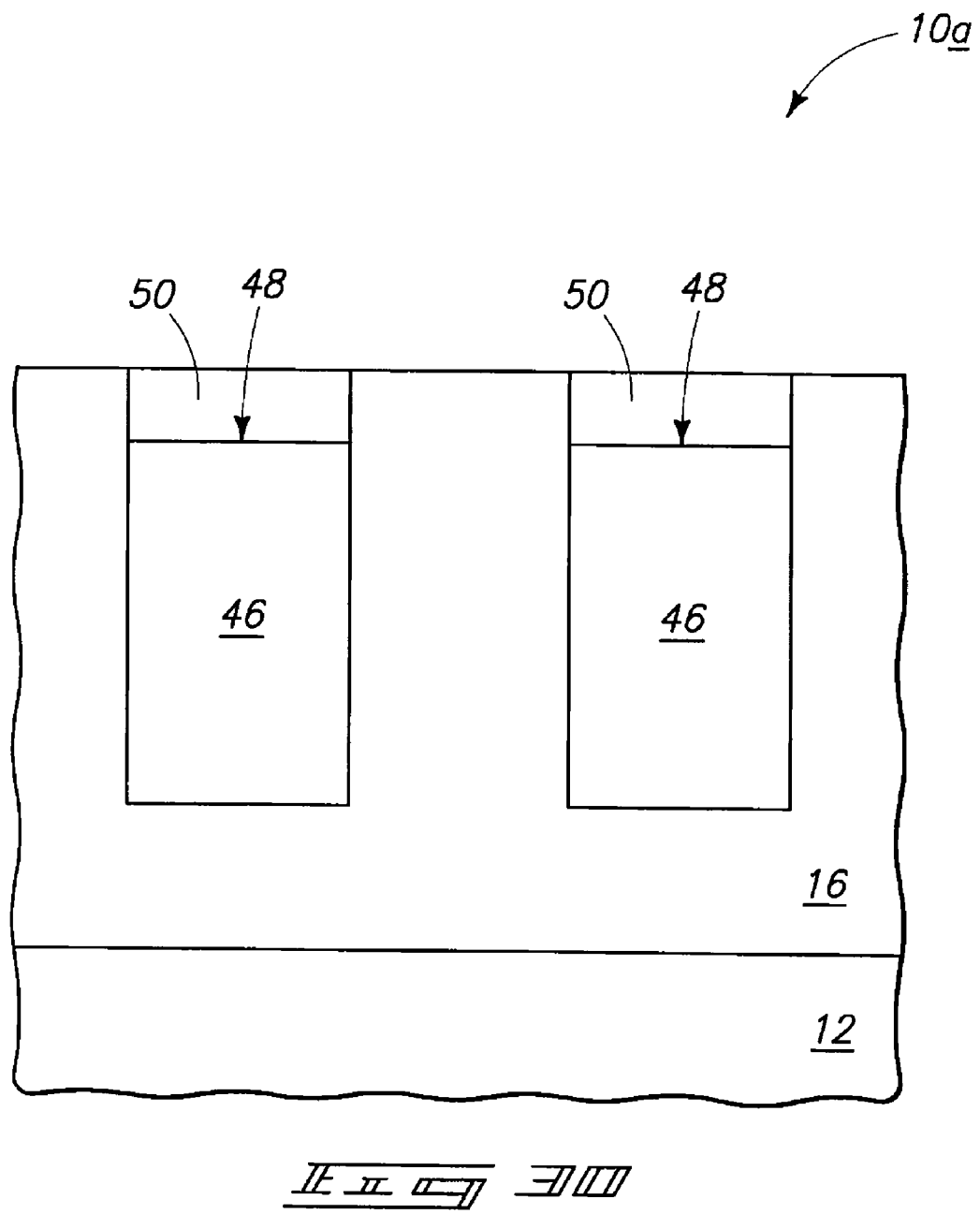

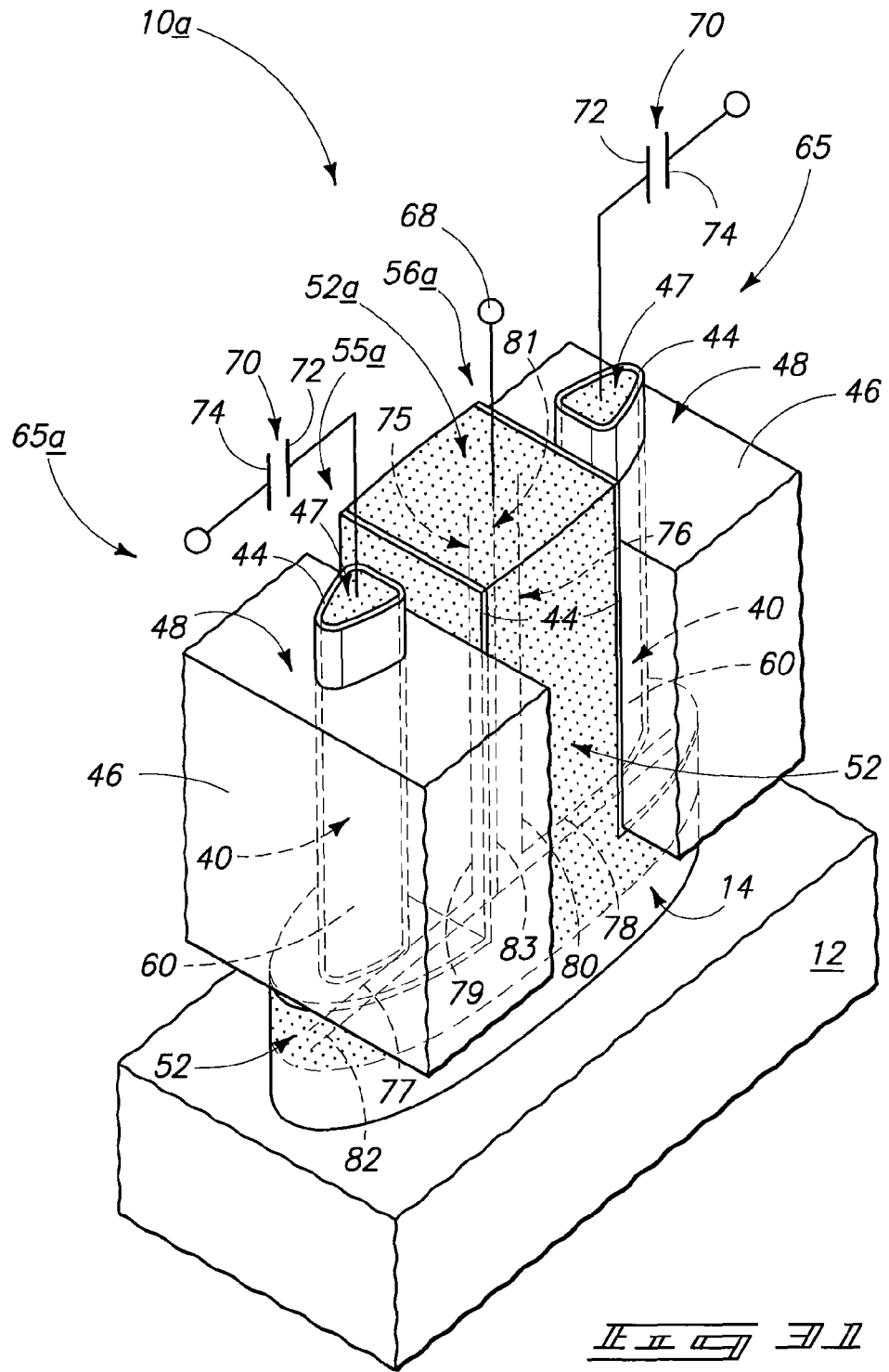

US 8,211,763 B2

METHODS OF FORMING VERTICAL FIELD EFFECT TRANSISTORS, VERTICAL FIELD EFFECT TRANSISTORS, AND DRAM CELLS

RELATED PATENT DATA

This patent resulted from a continuation application of U.S. patent application Ser. No. 12/187,809, filed Aug. 7, 2008, entitled "Methods of forming Vertical Field Effect Transistors, Vertical Field Effect Transistors, And DRAM Cells", naming Larson Lindholm and David K. Hwang as inventors, the disclosure of which is incorporated by reference.

TECHNICAL FIELD

Embodiments disclosed herein pertain to methods of forming vertical field effect transistors, including arrays of such transistors, for example for DRAM and other circuitry. Embodiments disclosed herein also pertain to vertical field effect transistors, including arrays of such transistors, and to DRAM cells.

BACKGROUND

Field effect transistors are devices commonly used in the fabrication of integrated circuitry. Such devices conventionally comprise a pair of conductive source/drain regions having a semiconductive channel region therebetween. A conductive gate is received operably proximate the channel region, and is separated therefrom by dielectric material. Application of suitable voltage to the gate causes current to flow from one of the source/drain regions to the other through the channel region, accordingly operating as a switch depending upon voltage application to the gate.

Transistors used in semiconductor constructions are supported by a semiconductor substrate. Such substrate might comprise bulk monocrystalline substrates, and/or semiconductor-on-insulator substrates. Regardless, the semiconductor substrate will have a primary surface which can be considered to define a horizontal direction. Field effect transistor devices can be divided into two broad categories based upon the orientations of the channel region relative to the primary surface of the semiconductor substrate. Specifically, transistor structures which have channel regions that are generally parallel to the primary surface of the substrate are referred to as planar or horizontal transistor structures. Those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions is primarily substantially orthogonal to a primary surface of a semiconductor substrate. Planar or horizontal transistor devices are devices in which the current flow between source and drain regions is primarily parallel to the primary surface of the semiconductor substrate.

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore is required to be refreshed/rewritten, and in many instances including multiple times per second.

One example volatile semiconductor memory is dynamic random access memory (DRAM). In one example, an individual DRAM cell includes a field effect transistor and a storage capacitor. One of the source/drain regions of the transistor connects with one electrode of the storage capacitor, while the other source/drain region electrically connects with a bit line. In some instances, pairs of immediately adjacent field effect transistors might share a common source/drain region to which a bit line electrically connects. DRAM cells may be characterized as requiring rewriting or refreshing multiple times a second. How often refresh must occur is effected by a number of factors, including degree of current/charge leakage. Two significant components of leakage include channel leakage of the transistor to underlying semiconductor substrate material, and junction or gate induced drain leakage.

BRIEF DESCRIPTION OF THE DRAWINGS

FIG. 6 is view of the FIG. 4 substrate at a processing step subsequent to that shown by FIG. 4.

FIG. 7 is a view of the FIG. 3 substrate at a processing step subsequent to that shown by FIG. 6.

FIG. 8 is a section view taken through line 8-8 in FIG. 7.

FIG. 9 is a section view taken through line 9-9 in FIG. 7.

FIG. 10 is a view of the FIG. 7 substrate at a processing step subsequent to that shown by FIG. 7.

FIG. 11 is a section view taken through line 11-11 in FIG. 10.

FIG. 20 is a view of the FIG. 17 substrate at a processing step subsequent to that shown by FIG. 17, and corresponding in sequence to that shown by FIG. 19.

FIG. 27 is a diagrammatic isometric view of the FIGS. 24-26 substrate incorporated in DRAM.

FIG. 28 is a diagrammatic view of an alternate embodiment semiconductor substrate fragment to that shown by FIG. 24.

FIG. 29 is a section view taken through line 29-29 in FIG. 28.

FIG. 30 is a section view taken through line 30-30 in FIG. 28.

FIG. 31 is a diagrammatic isometric view of the FIGS. 28-30 substrate incorporated in DRAM.

DETAILED DESCRIPTION OF EXAMPLE EMBODIMENTS

Figure 1:
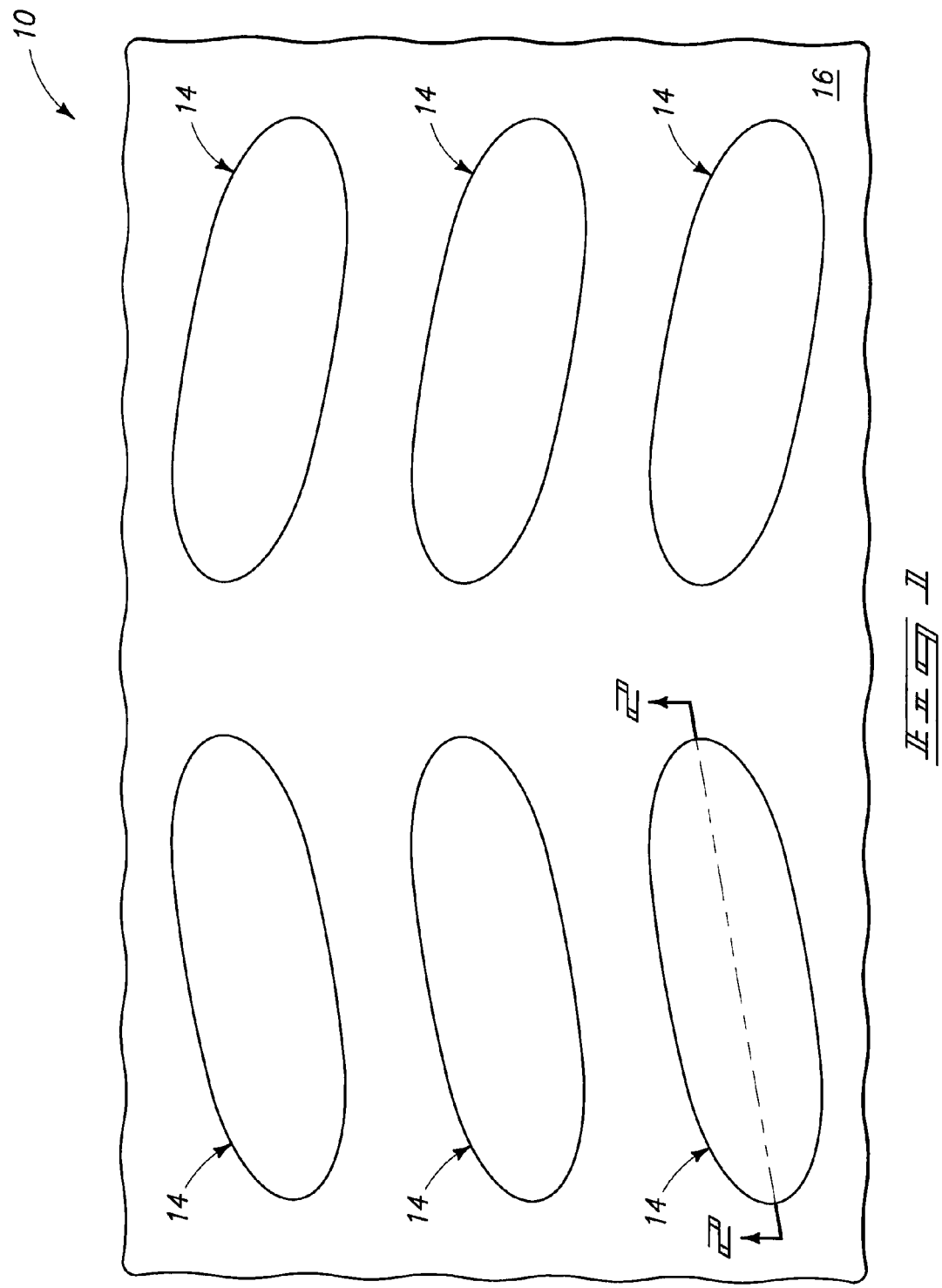
FIG. 1 is a diagrammatic top plan view of a semiconductor substrate fragment in process in accordance with example embodiments of the invention.
Figure 2:
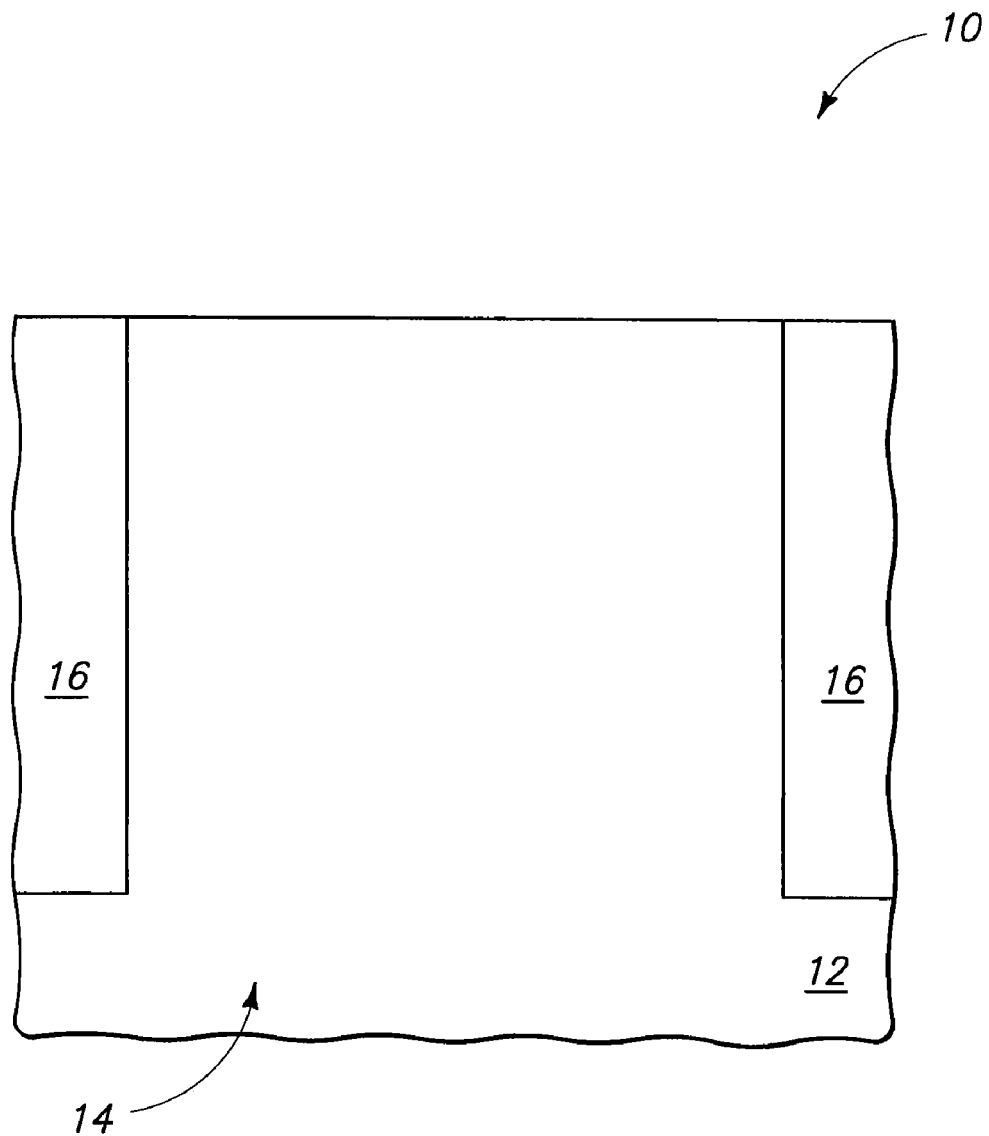
FIG. 2 is a diagrammatic section view taken through line 2-2 in FIG. 1.

Example methods of forming a vertical field effect transistor, including forming an array of such transistors, are described with reference to FIGS. 1-31. Referring initially to FIGS. 1 and 2, a semiconductor substrate in process is indicated generally with reference 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises bulk semiconductor material 12, for example lightly doped monocrystalline silicon. Although the description proceeds primarily with reference to bulk semiconductor processing, semiconductor-on-insulator processing and other substrates might also be used. Substrate 10 is depicted as having been processed to form a plurality of semiconductive material active area islands 14 which are radially surrounded by insulative isolation material 16 and which is received between adjacent of such islands. Example material 16 includes one or a combination of doped and/or undoped silicon dioxide, and silicon nitride. Substrate 10 might be fabricated to produce the FIGS. 1 and 2 construction by trench and refill, LOCOS, or other techniques, and whether existing or yet-to-be developed. In one embodiment, pairs of adjacent field effect vertical transistors will be fabricated with respect to individual of active area islands 14.

Figure 3:
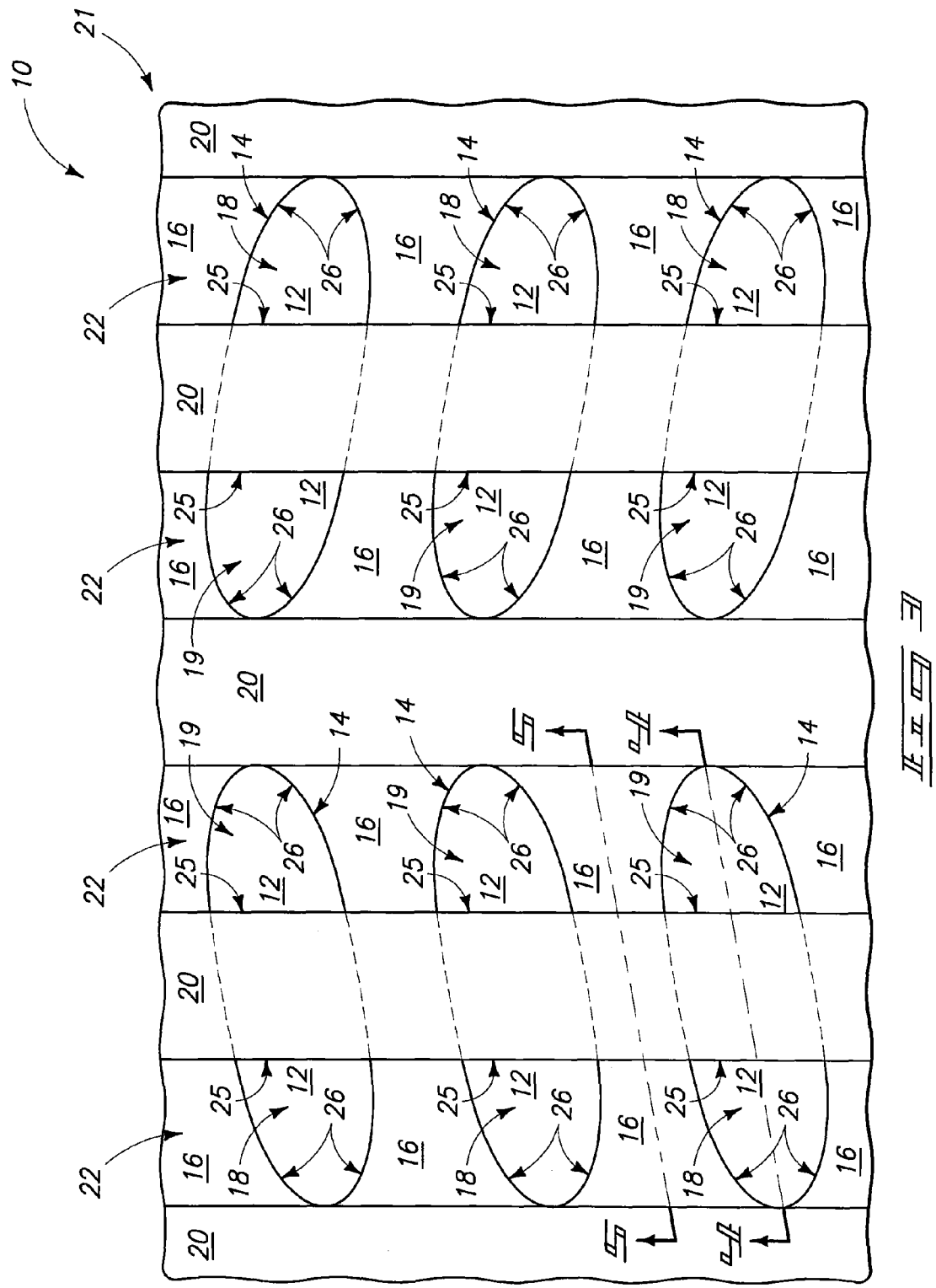
FIG. 3 is a view of the FIG. 1 substrate at a processing step subsequent to that shown by FIG. 1.
Figure 4:
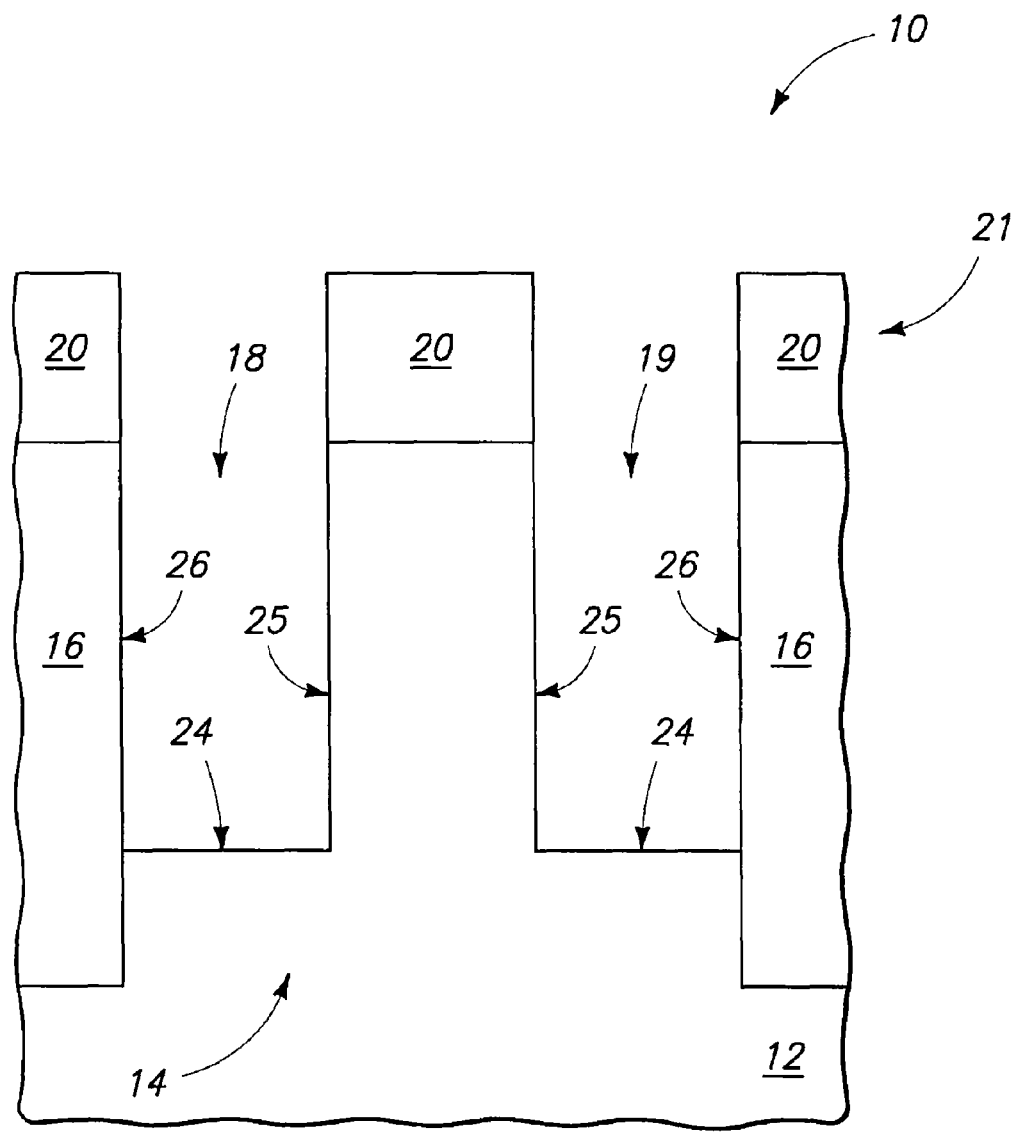
FIG. 4 is a section view taken through line 4-4 in FIG. 3.
Figure 5:
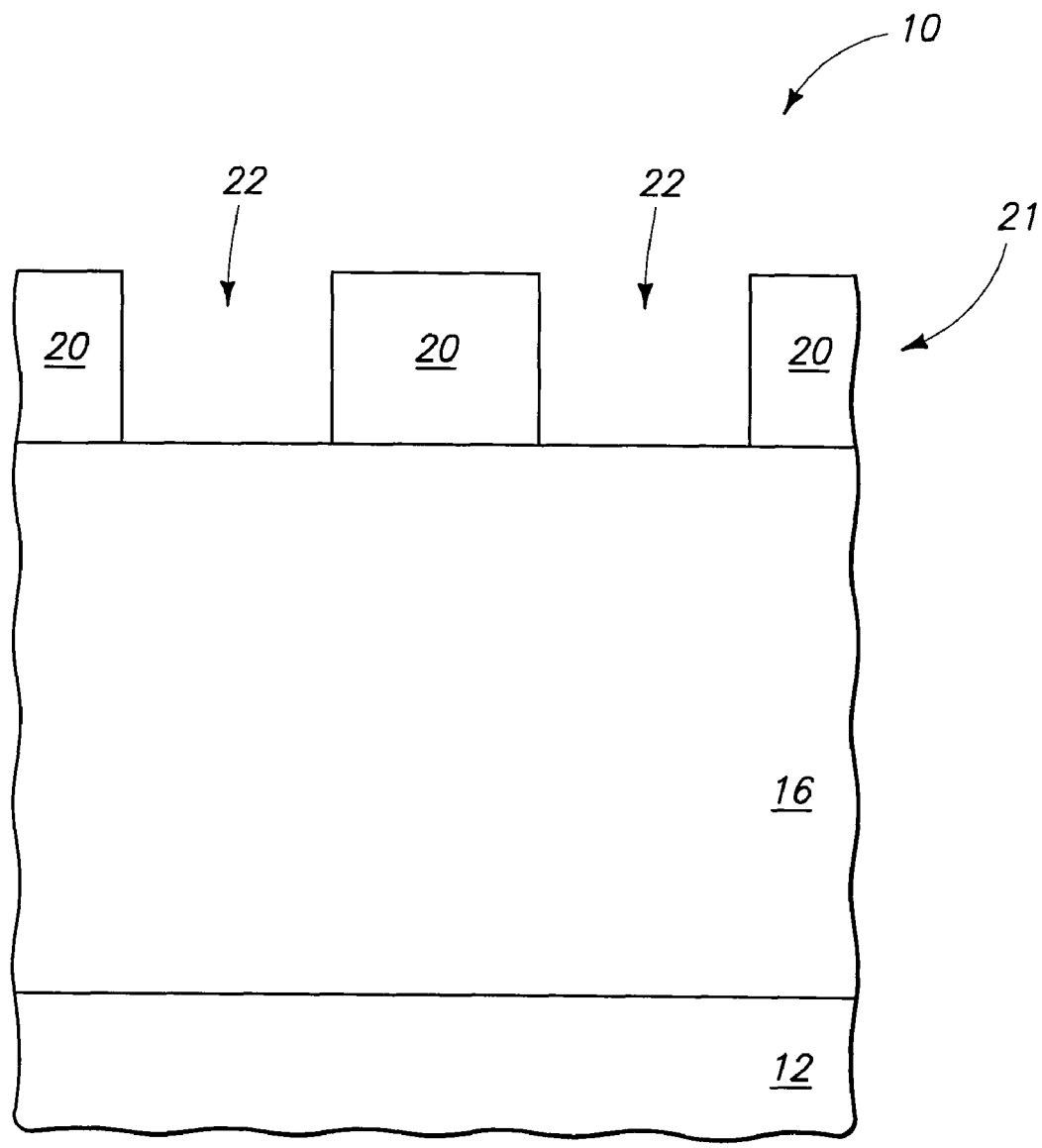
FIG. 5 is a section view taken through line 5-5 in FIG. 3.

Referring to FIGS. 3-5, a pair of laterally opposed openings 18, 19 has been etched into semiconductor material 12 at laterally opposed edges of each of active area islands 14. Such may be formed by any masking and etching techniques, whether existing or yet-to-be developed. FIGS. 3-5 depict creation of openings 18, 19 by deposition and patterning of a masking material 20, for example photoresist, and using such as an etch mask for formation of openings 18, 19. Specifically, FIGS. 3-5 depict masking material 20 having been patterned to form a mask 21 wherein a series of line openings 22 have been fabricated through masking material 20. Such extend inwardly to the laterally opposed edges of each of active areas 14, and overlie insulative isolation material 16 received between adjacent active area regions 14. Then in one embodiment, material 12 is etched selectively relative to material 16. Regardless, respective openings 18, 19 can be considered as comprising a base 24 and surrounding sidewalls 25, 26. Sidewall portions 25 comprise semiconductor material 12 of the respective active area island 14 that is received between pair of openings 18, 19. Sidewall portions 26 comprise insulative isolation material 16. By way of example only, an example depth for openings 18, 19 within semiconductor material 12 from an outermost surface thereof is from 500 Angstroms to 1,500 Angstroms.

Referring to FIG. 6, masking material 20 (not shown) has been removed and masking material 30 has been blanketly deposited over substrate 10 to less than fill openings 18, 19, and for convenience herein is referred to as a first masking material. First masking material 30 may be any of insulative, conductive, and/or semiconductive, for example depending upon degree of its subsequent removal as will be apparent from the continuing discussion. By ways of example only, an example insulative material is silicon nitride, an example semiconductive material is doped polysilicon, and an example conductive material is titanium nitride.

Referring to FIGS. 7-9, a mask 32 has been formed with a second masking material 34 and is received over first masking material 30. In one embodiment, second masking material 34 is of different composition from that of first masking material 30, for example to enable selective etching of each relative to the other. Mask 32 comprises and/or ultimately results in a plurality of line openings 33 that are individually received over a plurality of the openings 18 and/or 19 of different active area islands 14. In one embodiment, mask 32 is identical in configuration to that of mask 21 of FIGS. 3-5.

Figure 12:
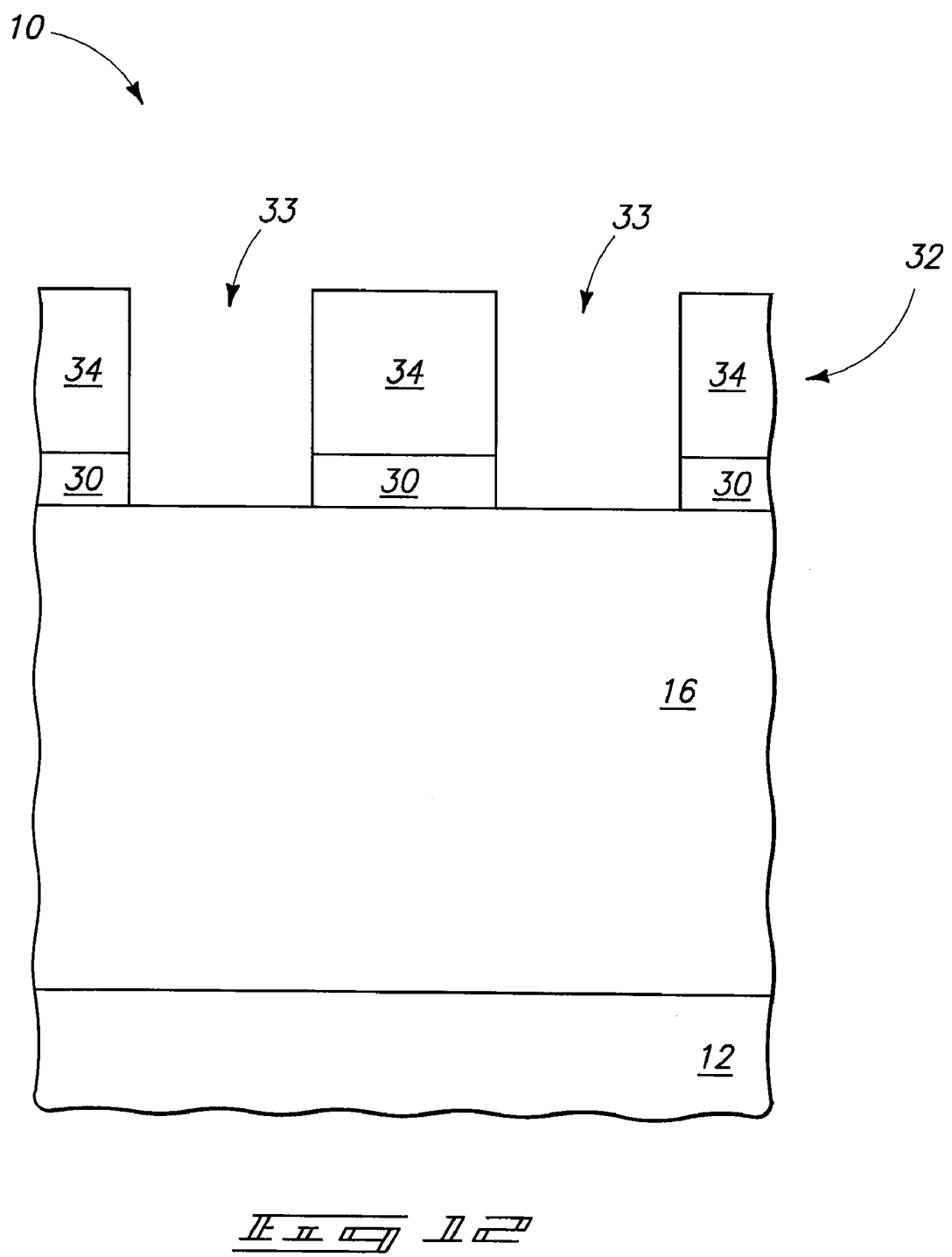
FIG. 12 is a section view taken through line 12-12 in FIG. 10.

Referring to FIGS. 10-12, first masking material 30 has been anisotropically etched through line openings 33 in second masking material 34 to form a lining 36 of first masking material 30 which surrounds opening sidewalls 25, 26, and is received over radially outermost portions of opening base 24 of each of pairs of openings 18, 19. Such provides but one example of lining surrounding opening sidewalls 25, 26 and radially outermost portions of openings base 24 of each of openings 18, 19 with some suitable masking material. In the depicted example, such has occurred by deposition followed by anisotropic etching of a masking material, such as masking material 30. Further by way of example only, such anisotropic etching has been conducted without any mask being received over openings 18, 19, yet with a mask received over at least some of insulative isolation material 16 and over some of semiconductive material 12 that is received between each of pairs of openings 18, 19. Further in the depicted example, the anisotropic etching is conducted with a mask that is received over all of semiconductive material 12 that is received between each of pairs of openings 18, 19. Alternate masking, or perhaps no masking, might also be conducted when lining the surrounding opening sidewalls and radially outermost portions of the opening base with masking material.

Figure 13:
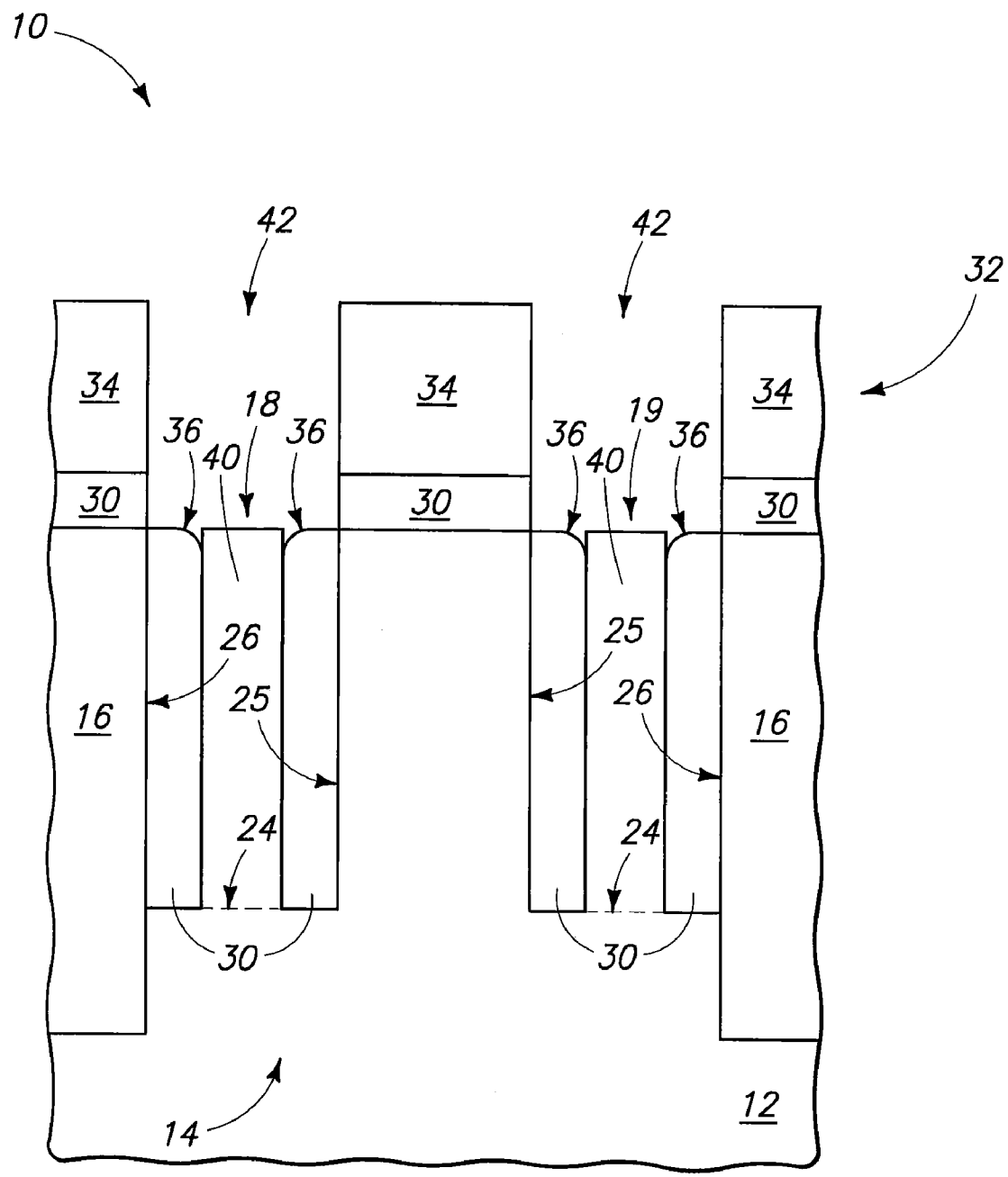
FIG. 13 is a view of the FIG. 11 substrate at a processing step subsequent to that shown by FIG. 11.

Referring to FIG. 13, a semiconductive material pillar 40 has been epitaxially grown to within each of pair of openings 18, 19 adjacent first masking material lining 36 from semiconductor material 12 at the respective opening base 24. Any suitable existing or yet-to-be developed epitaxial growth technique for growing semiconductive material pillar 40 from semiconductor material 20 is contemplated.

Figure 14:
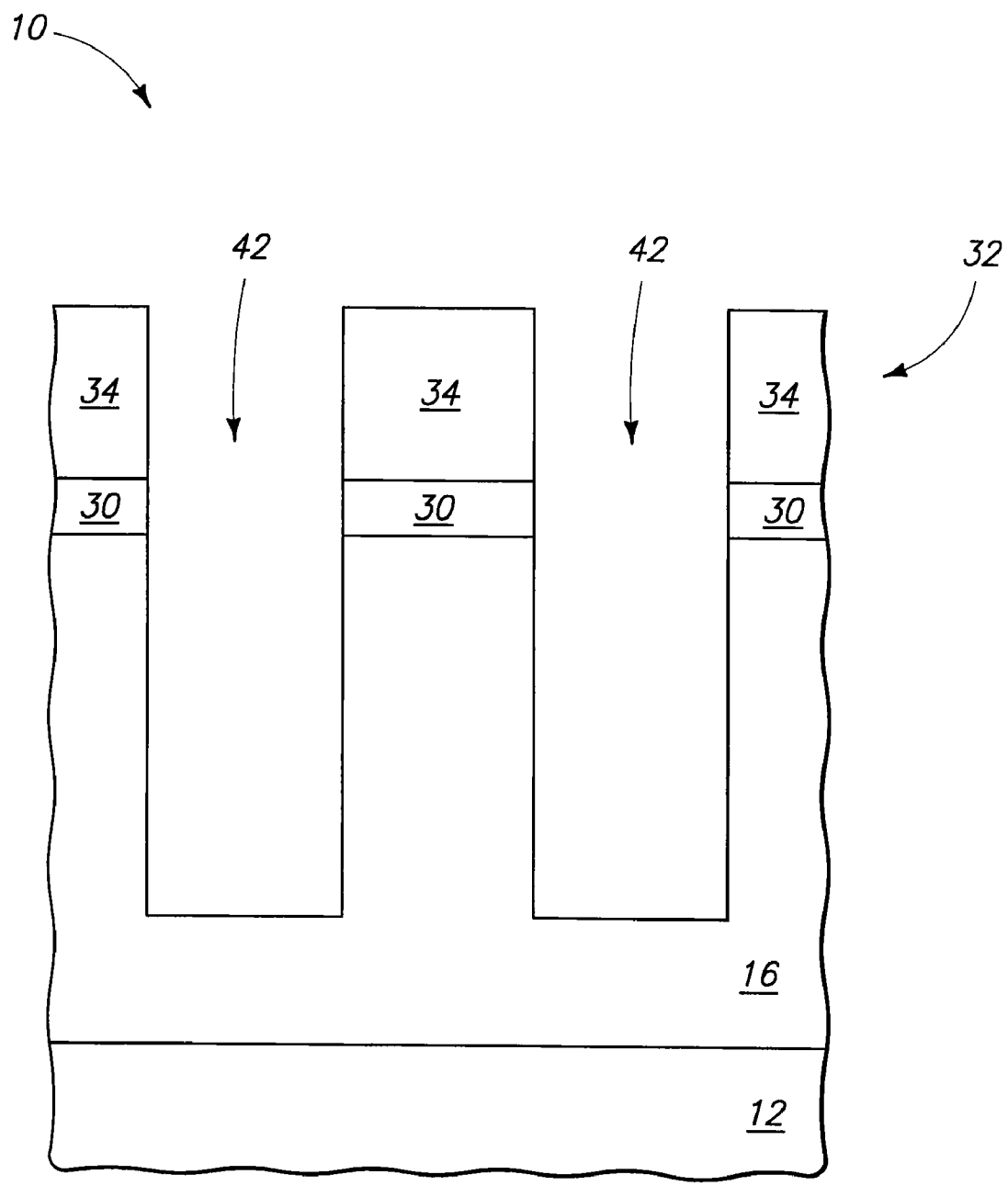
FIG. 14 is a view of the FIG. 12 substrate at a processing step subsequent to that shown by FIG. 12, and corresponding in sequence to that shown by FIG. 13.
Figure 15:
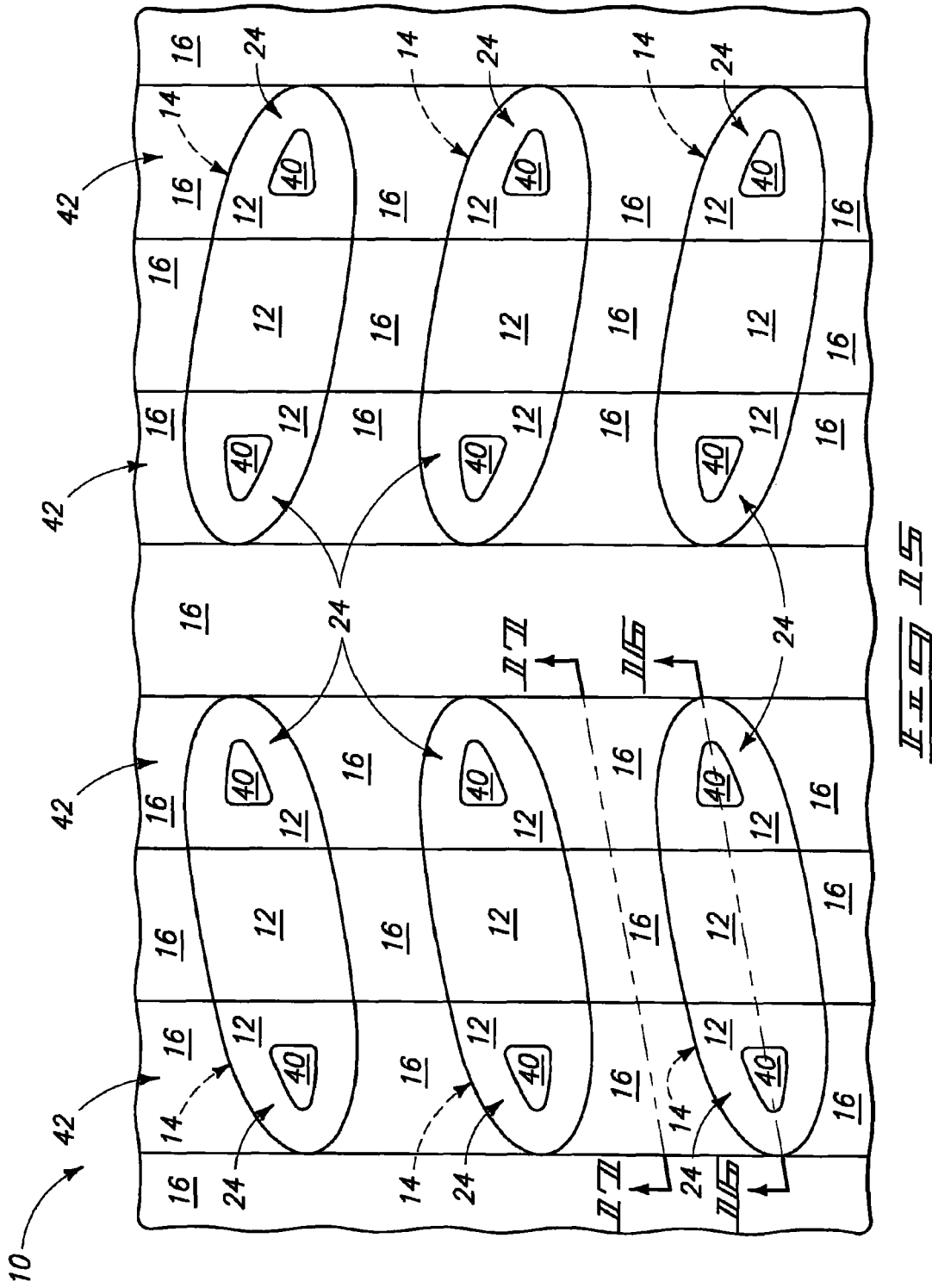
FIG. 15 is a view of the FIG. 10 substrate at a processing step subsequent to that shown by FIG. 10.
Figure 16:
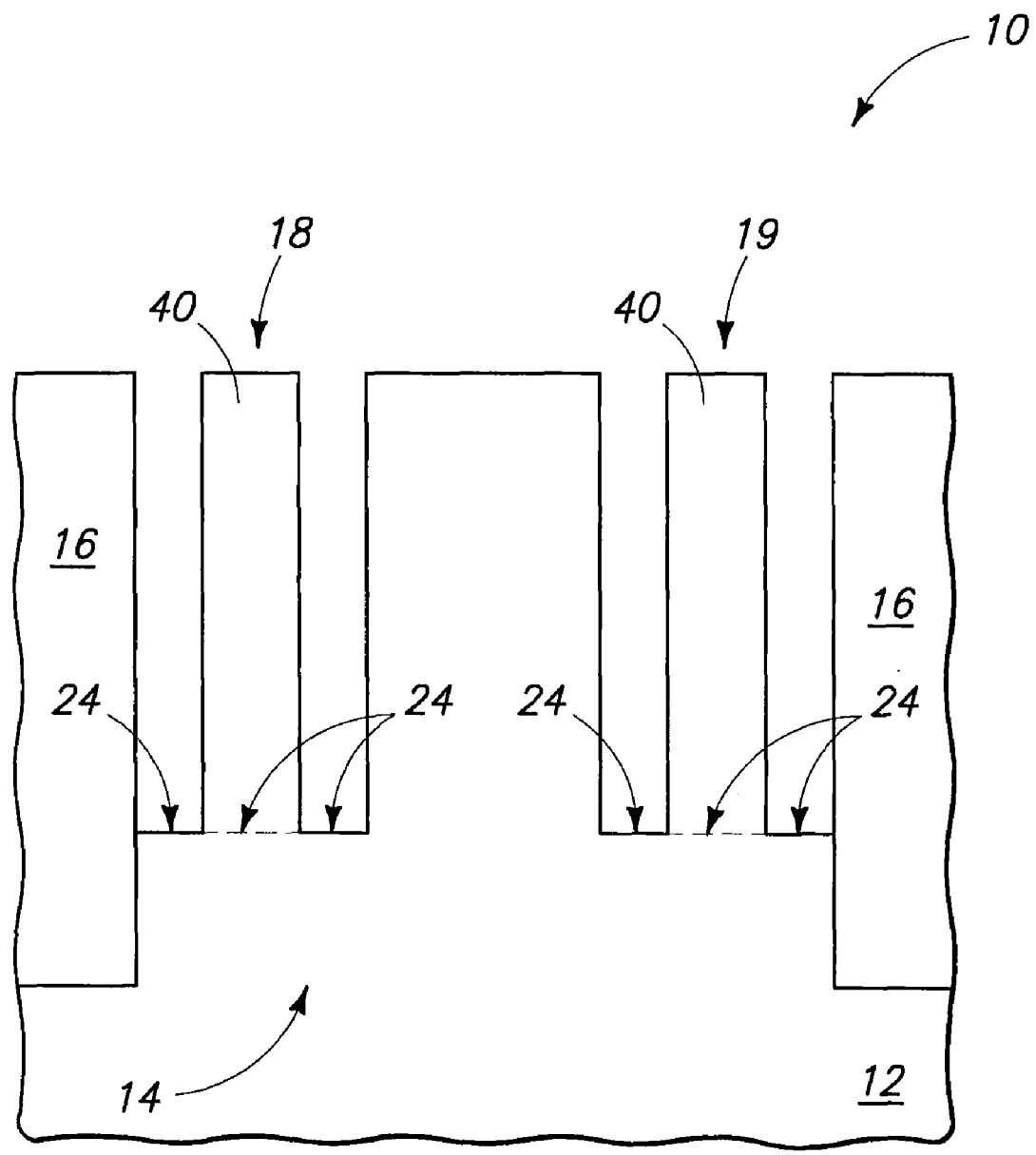
FIG. 16 is a section view taken through line 16-16 in FIG. 15.
Figure 17:
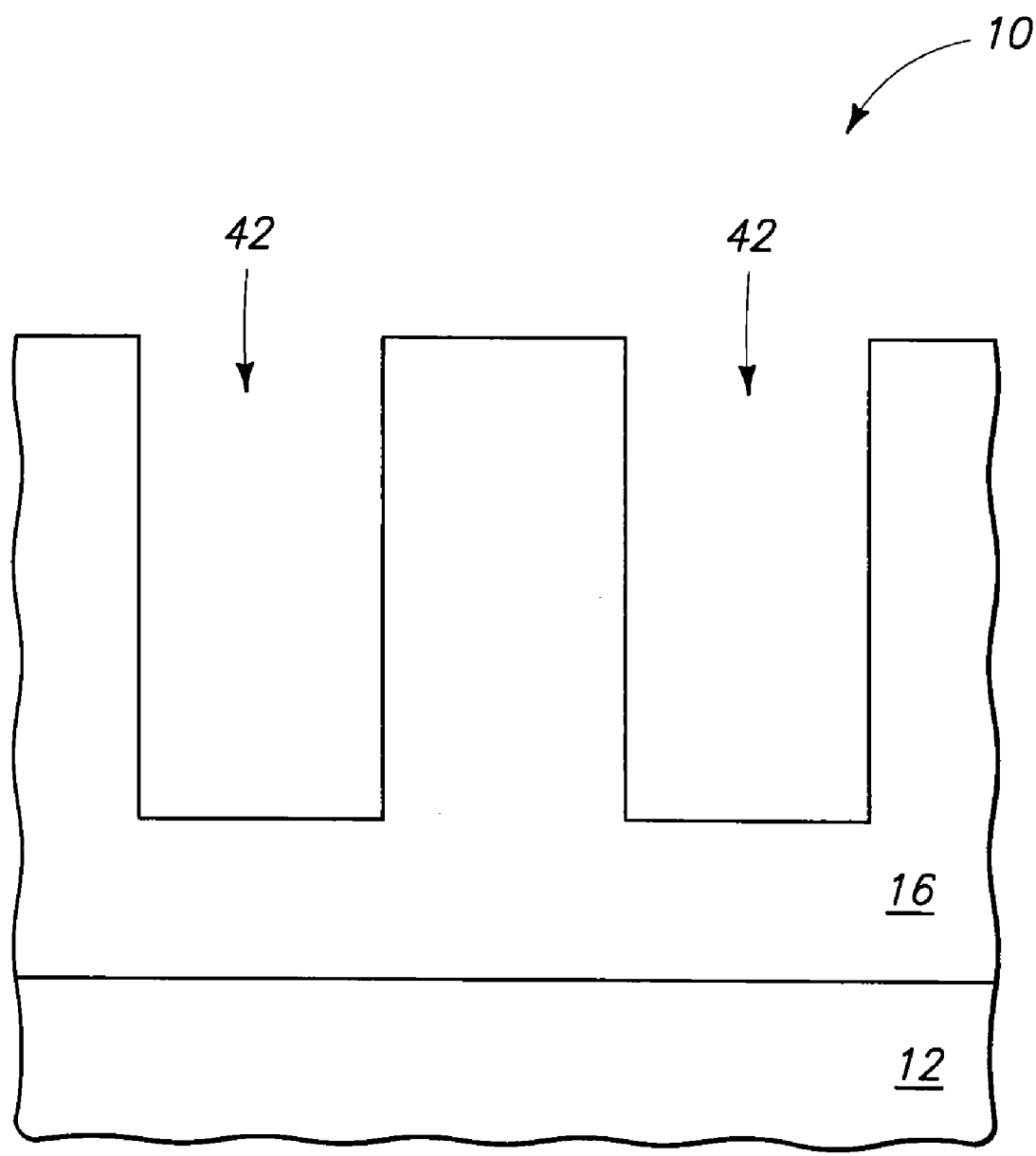
FIG. 17 is a section view taken through line 17-17 in FIG. 15.

Referring to FIG. 14, mask 32 has been used to etch insulative isolation material 16 received between active area islands 14 and form a series of gate line openings 42 which also effectively overlie respective pluralities of semiconductive material pillars 40. Such etching is ideally conducted highly selectively relative to the material of pillars 40.

Referring to claims 15-17, at least some of second masking material 34 (not shown) has been removed, and at least some of first masking material 30 (not shown) has been removed from each of openings 18, 19. In the depicted example embodiment, all of first masking material 30 (not shown) has been removed from openings 18, 19.

Figure 18:
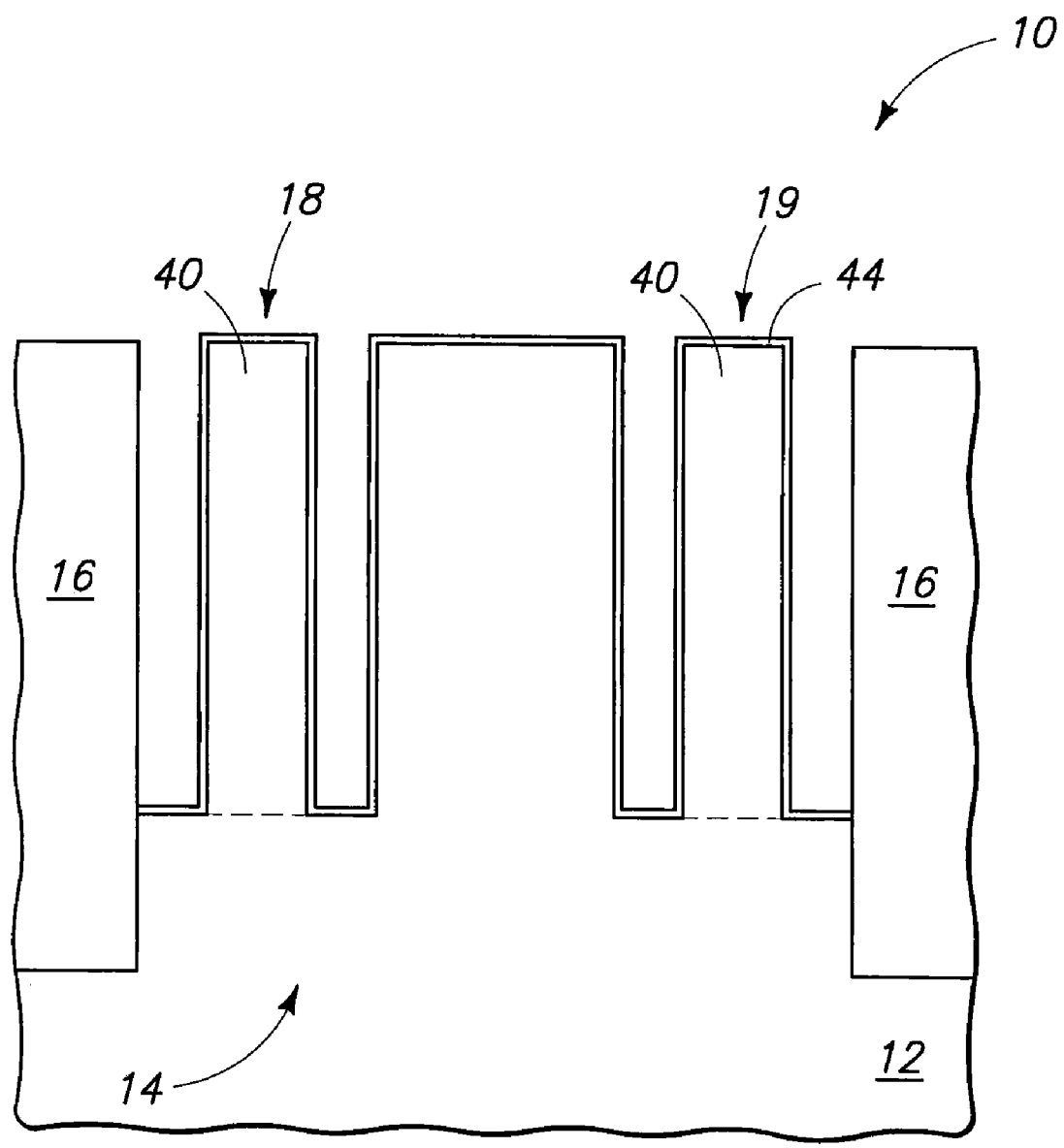
FIG. 18 is a view of the FIG. 16 substrate at a processing step subsequent to that shown by FIG. 16.

Referring to FIG. 18, a gate dielectric 44 has been formed radially about each of pillars 40. Any existing or yet-to-be developed gate dielectric is contemplated. In one example and as shown, gate dielectric is formed by oxidizing an outer portion of the semiconductor material of pillars 40 which also oxidizes semiconductor material 12.

Removal of second masking material 34 may occur before or after removing at least some of first masking material 30. Further, removing of second masking material 34 may occur before or after forming gate dielectric 44.

Figure 19:
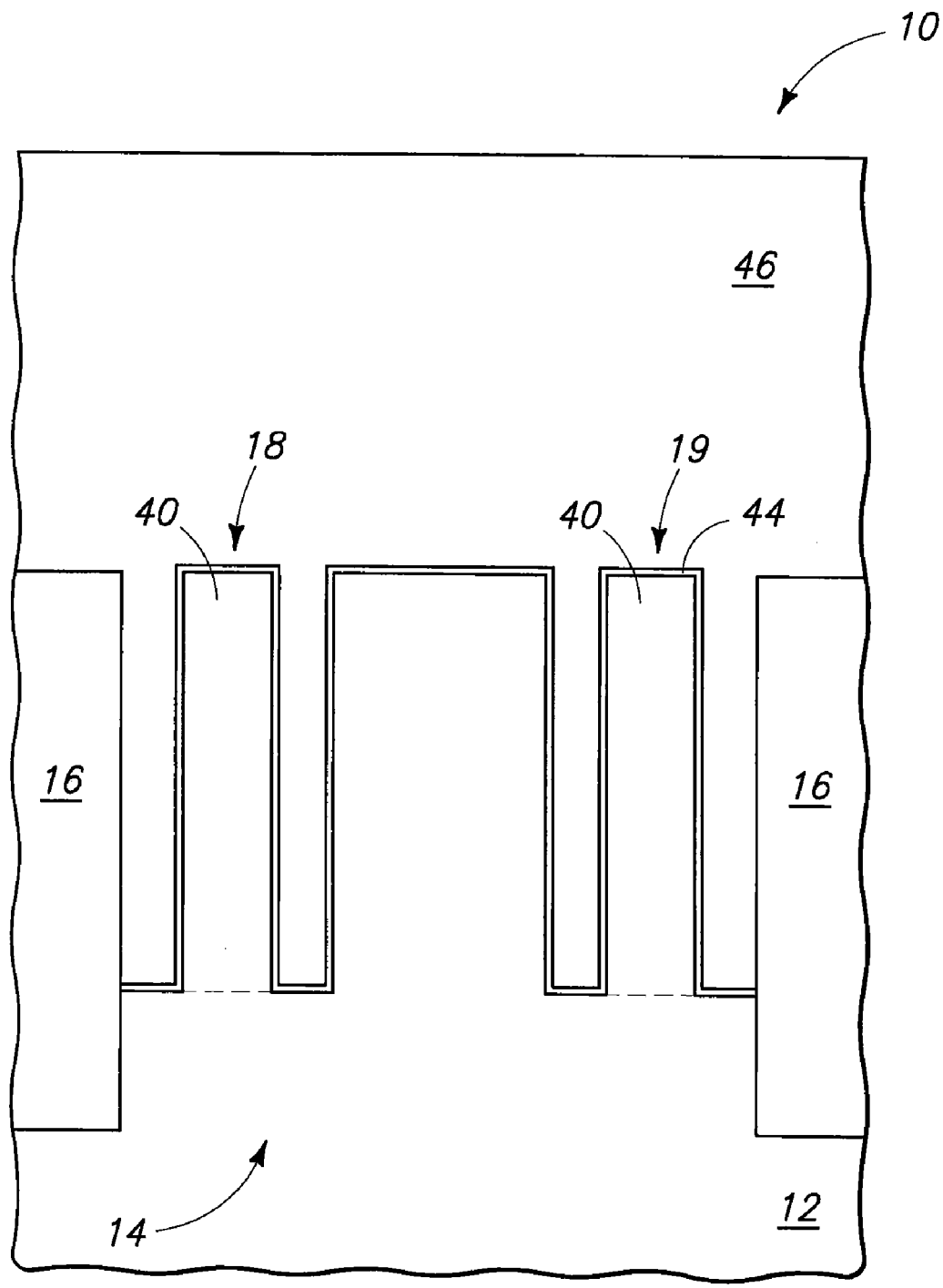
FIG. 19 is a view of the FIG. 18 substrate at a processing step subsequent to that shown by FIG. 18.

Referring to FIGS. 19 and 20, conductive gate material 46 has been formed into and overfills series of gate line openings 42, and accordingly is received radially about gate dielectric 44 that is received about each of pillars 40 within gate line openings 42. Conductive gate material 46 might be homogenous or non-homogenous. Example materials include elemental metals, alloys of elemental metals, conductive metal compounds, and/or conductively doped semiconductive material such as conductively doped polysilicon.

Figure 21:
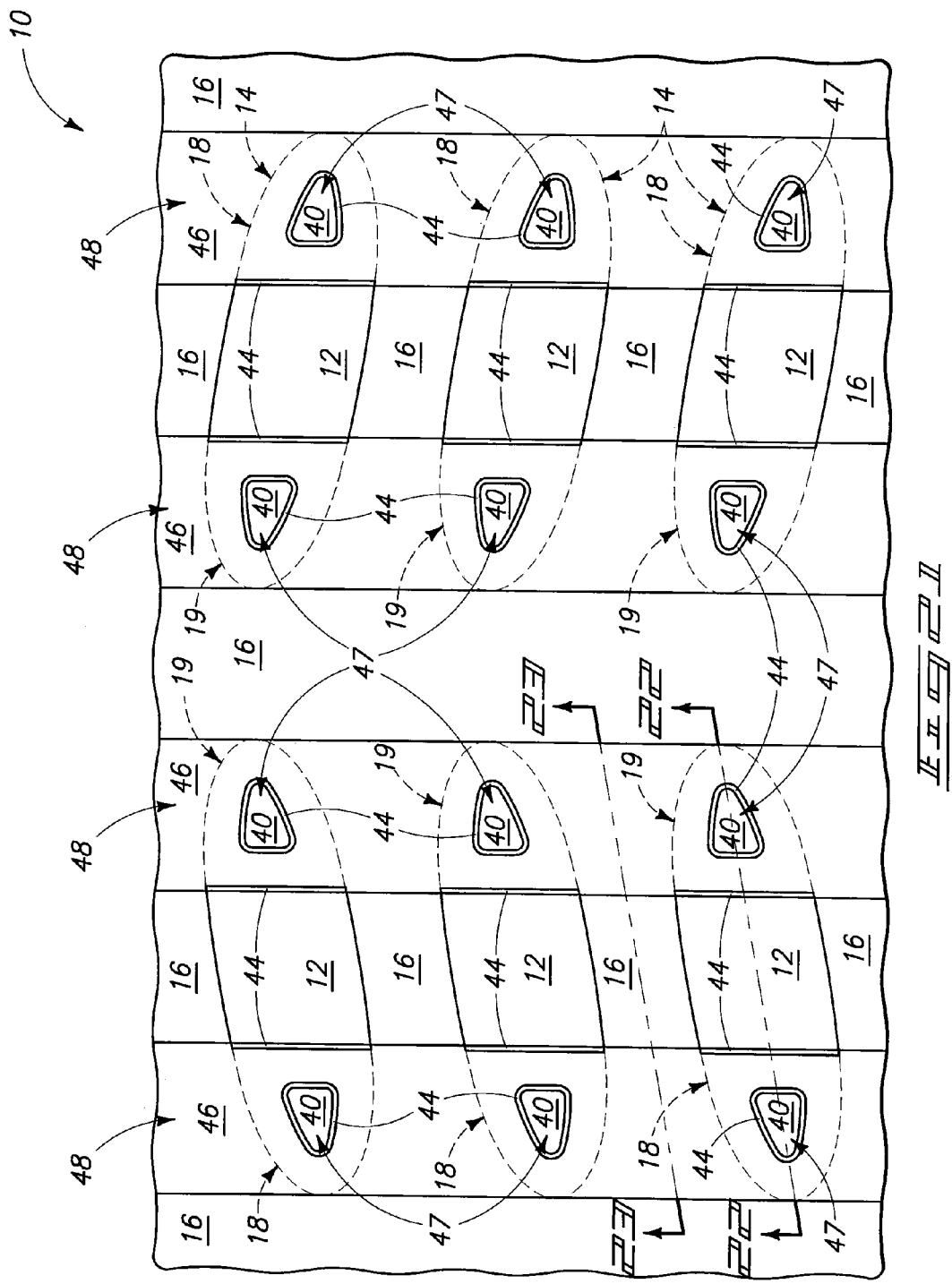
FIG. 21 is a view of the FIG. 15 substrate at a processing step subsequent to that shown by FIGS. 19 and 20.
Figure 22:
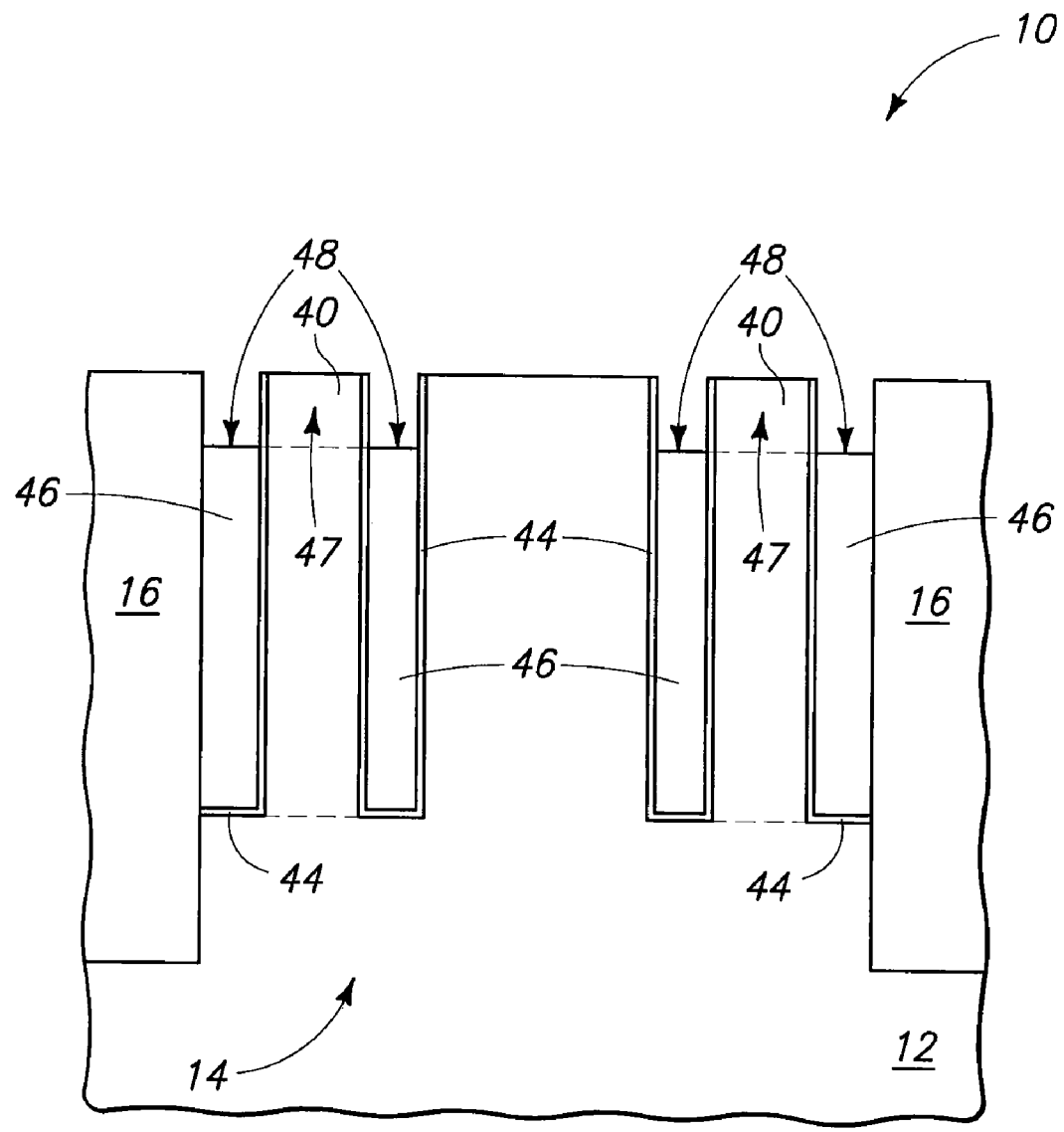
FIG. 22 is a section view taken through line 22-22 in FIG. 21.
Figure 23:
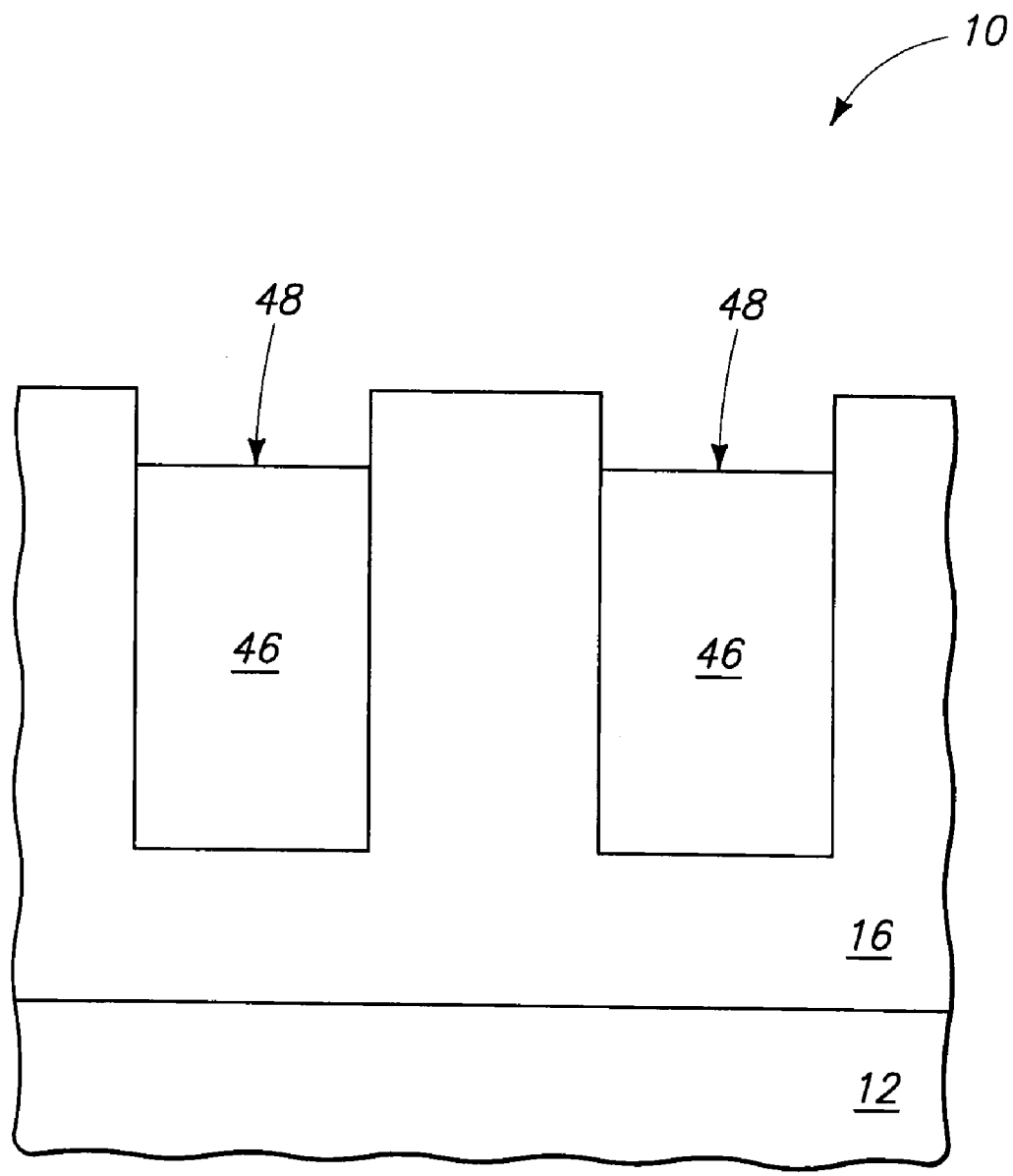
FIG. 23 is a section view taken through line 23-23 in FIG. 21.

Referring to FIGS. 21-23, conductive gate material 46 has been removed (for example by polishing and/or etching) at least outwardly of and to insulative isolation material 16 to form a series of gate lines 48 which effectively interconnect pluralities of gates of the vertical transistors within the array, for example along the respective lines 48 as shown. In one embodiment and as shown, the gate lines 48 are received within trenches within insulative isolation material 16 and extend between adjacent of active area islands 14. FIGS. 21-23 also depict recessing of conductive material 46 relative to insulative isolation material 16 to form upper portions 47 of each of pillars 40 which project upwardly within openings 18, 19 relative to series of gate lines 48.

Figure 24:
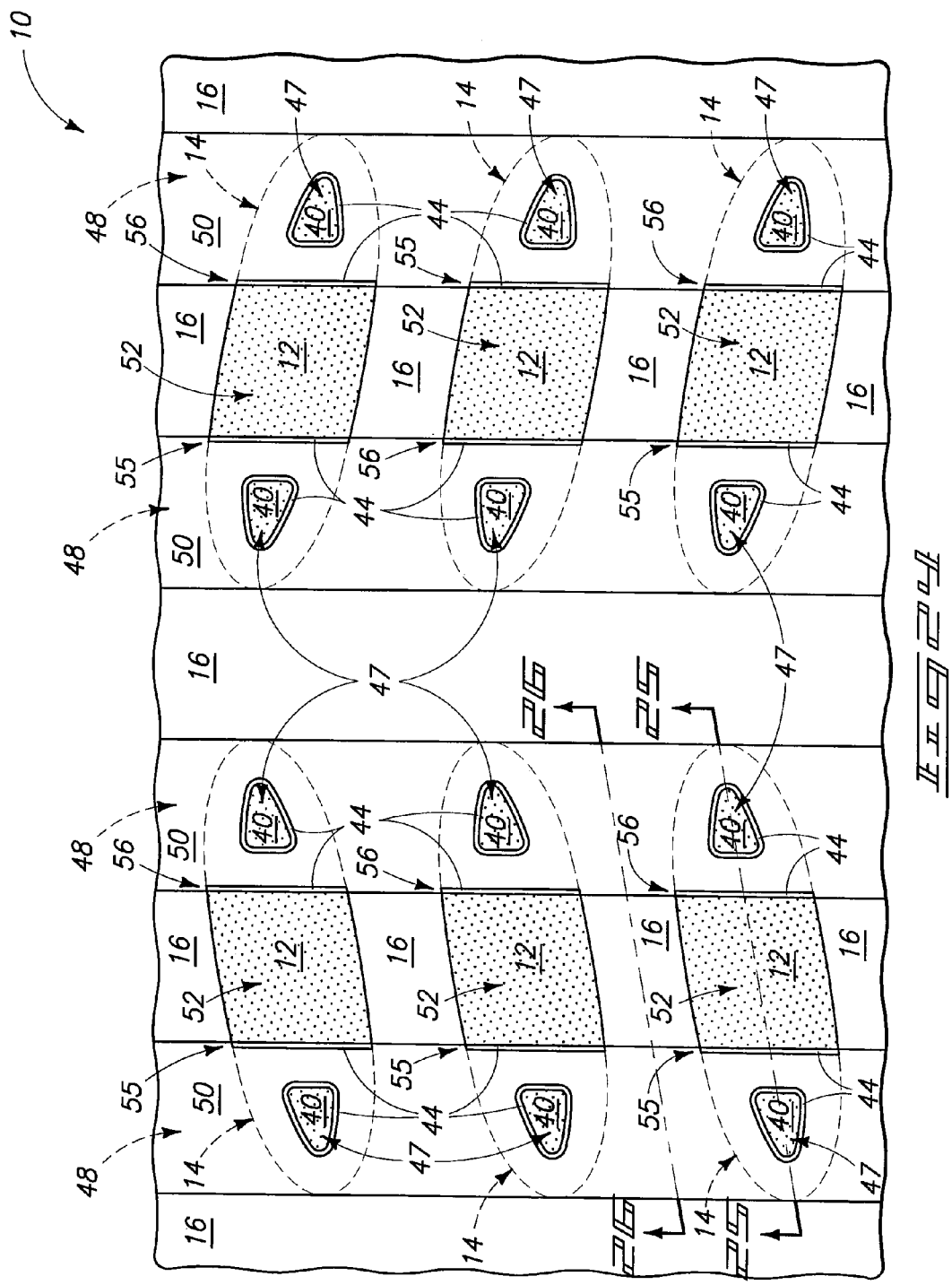
FIG. 24 is a view of the FIG. 21 substrate at a processing step subsequent to that shown by FIG. 21.
Figure 25:
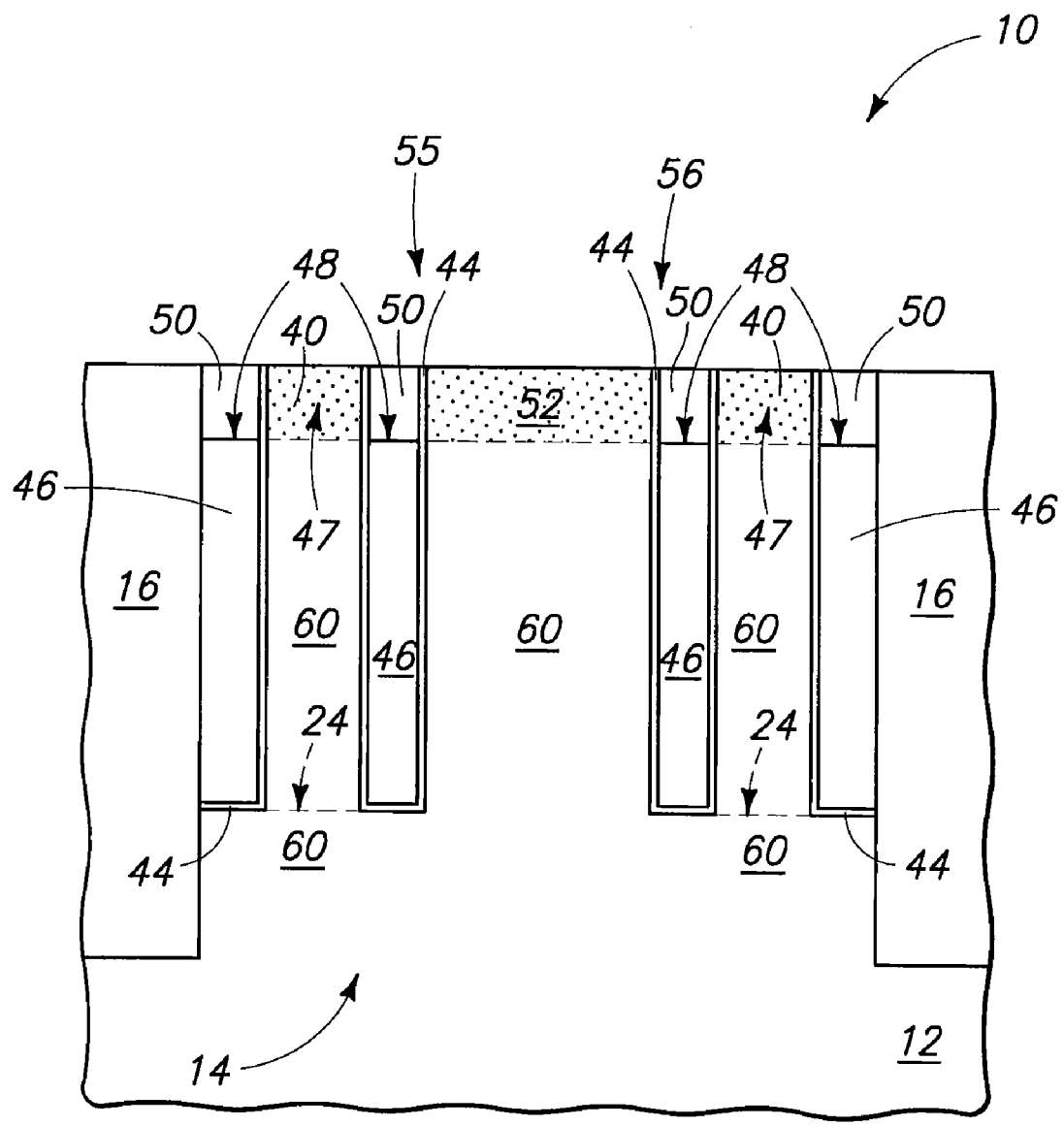
FIG. 25 is a section view taken through line 25-25 in FIG. 24.
Figure 26:
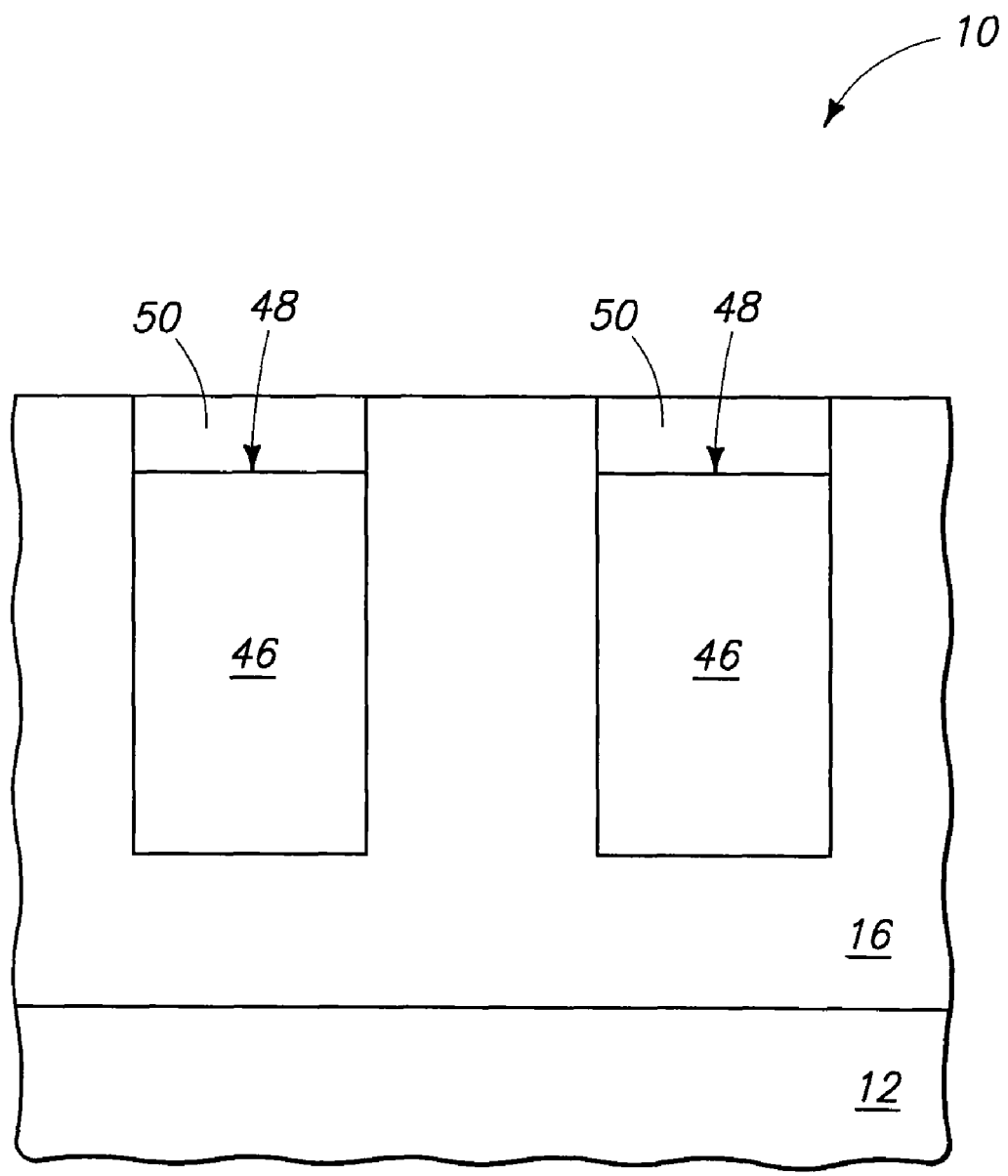
FIG. 26 is a section view taken through line 26-26 in FIG. 24.

Referring to FIGS. 24-26, insulating material 50 has been formed about projecting pillars 40 over conductive gate material 46. An example technique for doing so includes deposition of a suitable insulating material (i.e., one or both of silicon dioxide or silicon nitride) followed by polishing back relative to insulative isolation material 16.

An upper portion of each of pillars 40 is formed to comprise one source/drain region of one of the respective vertical transistors. For example, portion 47 of each pillar 40 can be suitably conductively doped to function as a source/drain region of a field effect transistor, as has been indicated by stippling. Semiconductive material 12 received between each of pair of openings 18, 19 can be formed to comprise another and a shared source/drain region of two adjacent of the vertical transistors. For example, FIGS. 24-26 depict adjacent respective pairs of transistors 55, 56. Region 52 between initial openings 18, 19 can be suitably conductively doped to function as such a shared source/drain region of each transistor 55, 56, also as has been shown by stippling. Such doping can occur, for example and by way of example only, at any time prior to or after epitaxial growth of semiconductive material pillars 40.

Further, semiconductive material of each of pillars 40 which is received below the respective one source/drain region 47, for example region 60, is formed to comprise a channel region of the respective vertical transistor. Alternate processing and designs are contemplated, which in one example is described below.

FIG. 27 depicts a diagrammatic perspective view of a pair of vertical transistors 55, 56 associated with an active area island 14. In one example implementation, the respective vertical transistors are formed to comprise a portion of a DRAM cell, for example with two DRAM cells 65 thereby being depicted. In one embodiment and as shown, upper portions 47 comprise respective source/drain regions of individual transistors of DRAM cells which connect with respective storage capacitors 70 of individual DRAM cells. In the depicted examples, upper portions 47 connect with a storage node electrode 72 of a respective capacitor 70. An opposing electrode 74 of individual capacitors 70 may, in one example, comprise a common cell electrode of all capacitors within a DRAM array. The other source/drain region 52 of each respective transistor 55, 56 is depicted diagrammatically as connecting with a suitable digit line 68.

Without being limited to any theory or operation or requirement, certain advantages may or may not be obtained by the above construction. For example, pillar-channels 60 of each transistor are surrounded by conductive gate electrode material 46, perhaps significantly improving control of the field effect transistor channels. Further in such configuration, junction leakage to underlying substrate from the channel may be significantly reduced since the channel is completely surrounded by the gate electrode.

An alternate embodiment to that shown by FIGS. 24-27 is shown and described with reference to FIGS. 28-31 in connection with a substrate fragment 10a. Like numerals from the FIGS. 24-27 embodiment have been utilized where appropriate, with differences being indicated with the suffix "a". In semiconductor fragment 10a, semiconductor material 12 below base 24 of each of pair of openings 18, 19 as well as semiconductor material 12 received between each of pair of openings 18, 19 has been formed to comprise another and a shared source/drain region of two adjacent of the vertical transistors. For example, FIGS. 28-30 depict adjacent respective pairs of transistors 55a, 56a. Region 52a beneath and between initial openings 18, 19 has been suitably conductively doped to function as such a shared source/drain region of each transistor 55a, 56a, also as has been shown by stippling. Such doping can occur, for example and by way of example only, at any time prior to epitaxial growth of semiconductive material pillars 40.

Further, semiconductive material of each of pillars 40 which is received between the respective one and another of the example source/drain regions 47 and 52a, for example region 60a, is formed to comprise a channel region of the respective vertical transistor. Alternate processing and designs are again contemplated.

FIG. 31 depicts a diagrammatic perspective view of pair of vertical transistors 55a, 56a associated with an active area island 14. In one example implementation, the respective vertical transistors are formed to comprise a portion of a DRAM cell, for example with two DRAM cells 65a thereby being depicted. In one embodiment and as shown, upper portions 47 comprise respective source/drain regions of individual transistors of DRAM cells which connect with respective storage capacitors 70 of individual DRAM cells. In the depicted examples, upper portions 47 connect with a storage node electrode 72 of a respective capacitor 70. An opposing electrode 74 of individual capacitors 70 may, in one example, comprise a common cell electrode of all capacitors within a DRAM array. The other source/drain region 52a of each respective transistor 55, 56 is depicted diagrammatically as connecting with a suitable digit line 68.

Embodiments of the invention also encompass vertical field effect transistors independent of method of fabrication. For example, referring to FIGS. 29 and 31, and by way of example only, either of transistors 55a, 56a comprises a pillar 40 projecting upwardly from semiconductive material of a substrate, for example from material 12. Pillar 40 comprises an upper portion of semiconductor material that is conductively doped effective to form a first of two source/drain regions of the vertical transistor (i.e. portion 47). Pillar 40 comprises a lower portion of semiconductor material that is effectively doped to form a channel region of the vertical transistor (i.e. region 60*a*). A gate dielectric is received radially about the channel region (i.e., material 44), and conductive gate material (i.e., material 46) is received radially about the gate dielectric.

A second of the two source/drain regions of the vertical transistor is L-shaped in vertical cross section. For example, each of vertical transistors 55*a*, 56*a* is depicted with a respective L cross section designated with numeral 75 or 76 with respect to its respective second source/drain region 52*a*. The L cross section-shaped second source/drain region comprises a horizontally oriented L-base segment (respectively designated with either numeral 77 or 78) which comprises conductively doped semiconductor material received beneath the respective pillar 40 and which extends laterally relative to such pillar for the respective source/drain region. The L-shaped second source/drain region 52*a* also comprises a vertically oriented L-stem segment (designated as 79 or 80) of conductively doped semiconductor material which is connected with the respective L-base segment 77 or 78 and extends upwardly parallel the respective pillar 40.

In one embodiment, the L-stem segment extends vertically along at least a majority of channel region 60*a*, with the depicted embodiment showing the L-stem segments as extending vertically along all of such channel regions. Further in one embodiment, the L-stem segment 79 or 80 extends vertically along at least a majority of first source/drain region 47. In the FIGS. 29 and 31 embodiment, such L-stem segments extend vertically along all of first source/drain regions 47.

Further considered, an embodiment of the invention contemplates a pair of adjacent vertical field effect transistors, for example transistors 55*a* and 56*a* as shown. Each transistor of such pair comprises a pillar which projects upwardly from semiconductor material of a substrate. Each pillar comprises an upper portion of semiconductor material that is conductively doped effective to form a first of two source/drain regions of one of the vertical transistors of the pair. Each pillar comprises a lower portion of semiconductor material that is effectively doped to form a channel region of one of the vertical transistors of the pair. A gate dielectric is received radially about the channel region of each of the pillars. Conductive gate material is received radially about the gate dielectric that is received radially about each of the pillars.

A second of the two source/drain regions of the pair of vertical transistors is T-shaped in vertical cross section and is shared by each of the pair of vertical transistors. For example in the above described embodiment, either of the second source/drain region which is associates with each transistor can be individually considered as being in a respective L-shaped vertical cross section as described above. Further collectively, such second of two source/drain regions can be considered as being T-shaped in vertical cross section and shared by each of the pair of vertical transistors 55*a*, 56*a*, and as has been designated with respect to an inverted T with numeral 81. For example, the T-shaped second source/drain region 52 can be considered as comprising a horizontally oriented segment 82 comprising conductively doped semiconductor material that is received beneath each of and extends between pillars 40. The T-shaped second source/drain region 52*a* also comprises a vertically oriented segment 83 of conductively doped semiconductor material. Segment 83 connects with horizontally oriented segment 82, and extends upwardly between and parallel the two pillars 40.

Further, embodiments of the invention encompass a pair of DRAM cells, including an array of multiple pairs of DRAM cells. For example as described immediately above, a pair of adjacent vertical field effect transistors 55*a*, 56*a* for a pair of DRAM cells is provided. A bit line 68 connects with an upper portion of vertically oriented segment 83 of semiconductor material of the shared second source/drain region 52*a*.

A first storage capacitor connects with the first source/drain region of one of the vertical transistors of the pair, for example the left-depicted capacitor 70 shown electrically connecting with first source/drain region 47 of vertical transistor 55*a*. A second storage capacitor connects with the first source/drain region of another of the vertical transistors of the pair, for example the right-depicted capacitor 70 which electrically connects with first source/drain region 47 of vertical transistor 56*a*.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a vertical field effect transistor, comprising:
    providing an opening comprising a semiconductor material-comprising base and semiconductor material-comprising surrounding sidewalls;
    epitixially growing a semiconductive material pillar to within the opening from the semiconductor material at the opening base to form the semiconductive material pillar to be radially spaced from the semiconductor material-comprising surrounding sidewalls;
    forming a gate dielectric radially about the pillar, and forming conductive gate material radially about the gate dielectric; and
    forming an upper portion of the pillar to comprise one source/drain region of the vertical transistor, forming semiconductive material of the pillar received below the upper portion to comprise a channel region of the vertical transistor, and forming semiconductor material adjacent the opening to comprise another source/drain region of the vertical transistor.

2. The method of claim 1 wherein forming the conductive gate material comprises depositing the conductive gate material to within the opening and thereafter recessing it to within the opening to leave the pillar projecting upwardly within the opening from the conductive gate material.

3. The method of claim 2 comprising forming insulating material within the opening about that portion of the pillar projecting upwardly from the conductive gate material.

4. The method of claim 1 comprising forming the vertical transistor to comprise a portion of a DRAM cell.

5. The method of claim 4 comprising forming the upper portion of the one source/drain region to connect with a storage node electrode of a capacitor of the DRAM cell and forming the another source/drain region to connect with a bit line.

6. A method of forming a vertical field effect transistor, comprising:
- providing an opening comprising a semiconductor material-comprising base and semiconductor material-comprising surrounding sidewalls;
- epitixially growing a semiconductive material pillar to within the opening from the semiconductor material at the opening base to form the semiconductive material pillar to be radially spaced from the semiconductor material-comprising surrounding sidewalls;
- forming a gate dielectric radially about the pillar, and forming conductive gate material radially about the gate dielectric; and
- forming an upper portion of the pillar to comprise one source/drain region of the vertical transistor, forming semiconductor material below the base of the opening to comprise another source/drain region of the vertical transistor, and forming semiconductive material of the pillar received between the one and another of the source/drain regions to comprise a channel region of the vertical transistor.

7. A method of forming a pair of adjacent field effect vertical transistors, comprising:
- forming a semiconductor material active area island radially surrounded by insulative isolation material;
- etching a pair of laterally opposed openings into the semiconductor material at laterally opposed edges of the active area island, the respective openings comprising a base and surrounding sidewalls, the surrounding sidewalls comprising semiconductor material of the active area island that is received between the pair of openings and comprising the insulative isolation material;
- epitixially growing a semiconductive material pillar to within each of said pair of openings from the semiconductor material at the respective opening base to form the semiconductive material pillar to be radially spaced from the semiconductor material-comprising surrounding sidewalls;
- forming a gate dielectric radially about each of the pillars, and forming conductive gate material radially about the gate dielectric that is received about each of the pillars; and
- forming an upper portion of each of the pillars to comprise one source/drain region of one of the pair of vertical transistors, forming semiconductive material of each of the pillars received below the respective upper portion to comprise a channel region of the respective vertical transistor, and forming semiconductor material received between each of the pair of openings to comprise another and shared source/drain region of both of the pair of vertical transistors.

8. The method of claim 7 comprising forming semiconductor material received below the base of each of the pair of openings to comprise a portion of said another and shared source/drain region.

9. A method of forming an array of vertical field effect transistors, comprising:
- forming a plurality of semiconductor material active area islands radially surrounded by insulative isolation material which is received between adjacent of said islands;
- etching a pair of laterally opposed openings into the semiconductor material at laterally opposed edges of each of the active area islands, the respective openings comprising a base and surrounding sidewalls, the surrounding sidewalls comprising semiconductor material of the respective active area island that is received between the pair of openings and comprising the insulative isolation material;
- epitixially growing a semiconductive material pillar to within each of said pair of openings from the semiconductor material at the respective opening base to form the semiconductive material pillar to be radially spaced from the semiconductor material-comprising surrounding sidewalls;
- forming a gate dielectric radially about each of the pillars;
- forming an upper portion of each of the pillars to comprise one source/drain region of one of the respective vertical transistors, forming semiconductive material of each of the pillars received below the respective upper portion to comprise a channel region of the respective vertical transistor, and forming semiconductor material received between each of the pair of openings to comprise another and shared source/drain region of two adjacent of the vertical transistors; and
- forming conductive gate material radially about the gate dielectric that is received about each of the pillars, the conductive gate material being formed into a series of gate lines interconnecting pluralities of gates of the vertical transistors within the array.

10. The method of claim 9 comprising forming the gate lines to be received within trenches within the insulative isolation material, the trenches extending between adjacent of the active area islands.

11. The method of claim 9 comprising forming semiconductor material received below the base of each of the pair of openings to comprise a portion of said another and shared source/drain region of two adjacent of the vertical transistors.

\* \* \* \* \*

UNITED STATES PATENT AND TRADEMARK OFFICE
CERTIFICATE OF CORRECTION

| | | |
|---|---|---|
| PATENT NO. | : 8,211,763 B2 | |
| APPLICATION NO. | : 13/036725 | |
| DATED | : July 3, 2012 | |
| INVENTOR(S) | : Larson D. Lindholm et al. | |

It is certified that error appears in the above-identified patent and that said Letters Patent is hereby corrected as shown below:

On the face page, in field (73), in "Assignee", in column 1, lines 1-2, delete "Micron Technologies, Inc., Boise, ID (US)" and insert -- Micron Technology, Inc., Boise, ID (US) --, therefor.

In column 8, line 37, in Claim 1, delete "epitixially" and insert -- epitaxially --, therefor.

In column 9, line 6, in Claim 6, delete "epitixially" and insert -- epitaxially --, therefor.

In column 9, line 34, in Claim 7, delete "epitixially" and insert -- epitaxially --, therefor.

In column 10, line 20, in Claim 9, delete "epitixially" and insert -- epitaxially --, therefor.

Signed and Sealed this
Thirtieth Day of October, 2012

David J. Kappos
*Director of the United States Patent and Trademark Office*